(12) United States Patent
Kim et al.

(10) Patent No.: US 8,797,303 B2
(45) Date of Patent: Aug. 5, 2014

(54) AMORPHOUS OXIDE SEMICONDUCTOR THIN FILM TRANSISTOR FABRICATION METHOD

(75) Inventors: Cheonhong Kim, San Diego, CA (US); John Hyunchul Hong, San Diego, CA (US); Yaoling Pan, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 409 days.

(21) Appl. No.: 13/052,446

(22) Filed: Mar. 21, 2011

(65) Prior Publication Data

US 2012/0242627 A1 Sep. 27, 2012

(51) Int. Cl.
| | |
|---|---|
| G09G 5/00 | (2006.01) |
| H01L 29/10 | (2006.01) |
| H01L 29/786 | (2006.01) |
| H01L 29/66 | (2006.01) |
| G02B 26/00 | (2006.01) |

(52) U.S. Cl.
CPC .... *H01L 29/66742* (2013.01); *H01L 29/78618* (2013.01); *H01L 29/78693* (2013.01); *G02B 26/001* (2013.01)
USPC ............... 345/204; 438/104; 257/43; 257/61; 257/E21.468; 257/E29.101; 257/E29.003

(58) Field of Classification Search
USPC ........................ 345/204; 438/104; 257/43, 61, 257/E21.468, E29.101, E29.003
See application file for complete search history.

(56) References Cited

U.S. PATENT DOCUMENTS

| | | | |
|---|---|---|---|
| 7,329,913 B2 | 2/2008 | Brask et al. | |
| 7,589,382 B2 | 9/2009 | Suzawa et al. | |
| 2006/0046354 A1* | 3/2006 | Kreipl | 438/132 |
| 2006/0066595 A1* | 3/2006 | Sampsell et al. | 345/204 |
| 2007/0241327 A1 | 10/2007 | Kim et al. | |
| 2008/0203387 A1 | 8/2008 | Kang et al. | |
| 2009/0001363 A1 | 1/2009 | Park et al. | |
| 2009/0096002 A1 | 4/2009 | Yu et al. | |
| 2009/0283763 A1 | 11/2009 | Park et al. | |
| 2010/0065838 A1 | 3/2010 | Yamazaki et al. | |
| 2010/0148169 A1 | 6/2010 | Kim et al. | |

(Continued)

FOREIGN PATENT DOCUMENTS

JP 2010-219094 9/2010

OTHER PUBLICATIONS

International Search Report and Written Opinion—PCT/US2012/028815—ISA/EPO—Jun. 13, 2012.

(Continued)

*Primary Examiner* — Stephen Sherman
(74) *Attorney, Agent, or Firm* — Weaver Austin Villeneuve & Sampson LLP

(57) ABSTRACT

This disclosure provides systems, methods and apparatus for fabricating thin film transistor devices. In one aspect, a substrate having a source region, a drain region, and a channel region between the source region and the drain region is provided. The substrate also includes an oxide semiconductor layer, a first dielectric layer overlying the channel region, and a first metal layer on the dielectric layer. A second metal layer is formed on the oxide semiconductor layer overlying the source region and the drain region. The oxide semiconductor layer and the second metal layer are treated to form a heavily doped n-type oxide semiconductor in the oxide semiconductor layer overlying the source region and the drain region. An oxide in the second metal layer also can be formed.

14 Claims, 17 Drawing Sheets

(56) References Cited

U.S. PATENT DOCUMENTS

| | | |
|---|---|---|
| 2010/0213460 A1 | 8/2010 | Kondo et al. |
| 2010/0230814 A1 | 9/2010 | Marks et al. |
| 2010/0330763 A1 | 12/2010 | Freeman et al. |
| 2011/0003430 A1 | 1/2011 | Yamazaki et al. |
| 2011/0136301 A1 | 6/2011 | Yamazaki et al. |
| 2011/0240998 A1 | 10/2011 | Morosawa et al. |
| 2013/0127694 A1 | 5/2013 | Kim et al. |

OTHER PUBLICATIONS

Second Written Opinion from International Patent Application No. PCT/US2012/028815, dated Apr. 23, 2013, pp. 6.

* cited by examiner

AMORPHOUS OXIDE SEMICONDUCTOR THIN FILM TRANSISTOR FABRICATION METHOD

TECHNICAL FIELD

This disclosure relates generally to thin film transistor devices and more particularly to fabrication methods for thin film transistor devices.

DESCRIPTION OF THE RELATED TECHNOLOGY

Electromechanical systems include devices having electrical and mechanical elements, actuators, transducers, sensors, optical components (e.g., mirrors) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of electromechanical systems device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

Hardware and data processing apparatus may be associated with electromechanical systems. Such hardware and data process apparatus may include a thin film transistor (TFT) device. A TFT device is a kind of field-effect transistor that includes a source region, a drain region, and a gate region in a semiconductor material.

SUMMARY

The systems, methods and devices of the disclosure each have several innovative aspects, no single one of which is solely responsible for the desirable attributes disclosed herein.

One innovative aspect of the subject matter described in this disclosure includes a method of forming a heavily doped n-type oxide semiconductor. In some implementations, a substrate is provided. The substrate has a surface including a source region, a drain region, and a channel region, with the channel region being between the source region and the drain region. The substrate also includes an oxide semiconductor layer on the surface of the substrate, a first dielectric layer on the oxide semiconductor layer overlying the channel region, and a first metal layer on the first dielectric layer. A second metal layer is formed on the oxide semiconductor layer overlying the source region and the drain region. The oxide semiconductor layer and the second metal layer are treated to form a heavily doped n-type oxide semiconductor in the oxide semiconductor layer overlying the source region and the drain region and an oxide in the second metal layer overlying the source region and the drain region.

In some implementations, a metal of the second metal layer can include at least one of magnesium, titanium, and manganese. In some implementations, a metal of the second metal layer can form an oxide having a lower Gibbs free energy than oxides in the oxide semiconductor layer.

In some implementations, the treatment can cause oxygen in the oxide semiconductor layer overlying the source region and the drain region to diffuse into the second metal layer overlying the source region and the drain region. In some implementations, the treatment can include a heat treatment performed at a temperature of about 200 to 500° C. for a duration of about 30 minutes to 10 hours.

In some implementations, a substrate is provided. The substrate has a surface including a source region, a drain region, and a channel region, with the channel region being between the source region and the drain region. A first metal layer is formed on the source region and the drain region of the substrate. An oxide semiconductor layer is formed on the first metal layer and on the channel region of the substrate. A first dielectric layer is formed on the oxide semiconductor layer overlying the channel region. A second metal layer is formed on the first dielectric layer. A third metal layer is formed on the oxide semiconductor layer overlying the source region and the drain region. The oxide semiconductor layer overlying the source region and the drain region is treated to form a heavily doped n-type oxide semiconductor in the oxide semiconductor layer overlying the source region and the drain region and to form an oxide in the first metal layer and in the third metal layer overlying the source region and the drain region.

In some implementations, an apparatus includes a substrate including a surface. An oxide semiconductor is provided over the substrate surface. A channel region of the oxide semiconductor layer is between a source region and a drain region of the oxide semiconductor layer. The source region and the drain region of the oxide semiconductor layer are a heavily doped n-type oxide semiconductor. A first dielectric is on the channel region of the oxide semiconductor. A first metal is on the first dielectric. A first metal oxide is on the source region and on the drain region of the oxide semiconductor. A second dielectric is on the first metal and on the first metal oxide. A first metal contact contacts the source region of the oxide semiconductor. A second metal contact contacts the drain region of the oxide semiconductor.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
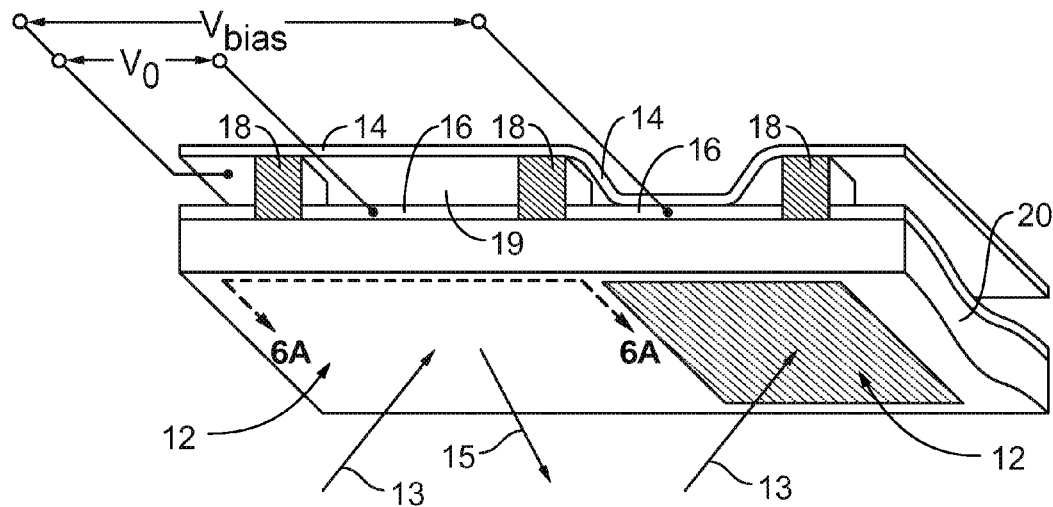
FIG. 1 shows an example of an isometric view depicting two adjacent pixels in a series of pixels of an interferometric modulator (IMOD) display device.

The following detailed description is directed to certain implementations for the purposes of describing the innovative aspects. However, the teachings herein can be applied in a multitude of different ways. The described implementations may be implemented in any device that is configured to display an image, whether in motion (e.g., video) or stationary (e.g., still image), and whether textual, graphical or pictorial. More particularly, it is contemplated that the implementations may be implemented in or associated with a variety of electronic devices such as, but not limited to, mobile telephones, multimedia Internet enabled cellular telephones, mobile television receivers, wireless devices, smartphones, bluetooth devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (e.g., e-readers), computer monitors, auto displays (e.g., odometer display, etc.), cockpit controls and/or displays, camera view displays (e.g., display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (e.g., electromechanical systems (EMS), MEMS and non-MEMS), aesthetic structures (e.g., display of images on a piece of jewelry) and a variety of electromechanical systems devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes, electronic test equipment. Thus, the teachings are not intended to be limited to the implementations depicted solely in the Figures, but instead have wide applicability as will be readily apparent to one having ordinary skill in the art.

Some implementations described herein relate to thin film transistor (TFT) devices with heavily doped n-type oxide semiconductor (i.e., an n+ semiconductor) source and drain regions and methods of their fabrication. In some implementations, a layer of a metal having a strong oxygen affinity relative to an underlying oxide semiconductor is deposited on top of the oxide semiconductor. For example, metals having a strong affinity for oxygen compared to an InGaZnO oxide semiconductor include titanium (Ti), manganese (Mn), and magnesium (Mg). A metal having a strong affinity for oxygen relative to an oxide semiconductor is a metal with a metal oxide having a lower Gibbs free energy than the oxide constituent(s) of the oxide semiconductor. Any metal with its metal oxide having a lower Gibbs free energy than the oxide constituent(s) of the oxide semiconductor may be used. The oxide semiconductor and metal layer are then treated such that oxygen in the oxide semiconductor diffuses into the metal layer. This forms oxygen vacancies in the oxide semiconductor which can serve as electron donors, increasing the carrier concentration in the semiconductor. A metal oxide layer is formed in at least a portion of the treated metal layer.

In some implementations, a TFT device can be fabricated on a substrate. The substrate has a surface including a source region, a drain region, and a channel region, with the channel region being between the source region and the drain region. An oxide semiconductor layer is formed on the surface of the substrate. A dielectric layer configured to act as a gate insulator is formed on the oxide semiconductor layer overlying the channel region. A first metal layer configured to act as a gate is formed on the dielectric layer. A second metal layer having a strong oxygen affinity relative to the oxide semiconductor layer is deposited on top of the oxide semiconductor layer overlying the source region and the drain region. During a treatment, a heavily doped n-type oxide semiconductor is formed in the oxide semiconductor layer overlying the source region and the drain region due to oxygen diffusing out of the oxide semiconductor layer and into the second metal layer. The heavily doped n-type oxide semiconductor overlying the source region of the substrate forms the source of the TFT device. The heavily doped n-type oxide semiconductor overlying the drain region of the substrate forms the drain of the TFT device. The oxide semiconductor layer under the dielectric layer and overlying the channel region of the substrate forms the channel of the TFT device. Further operations are then performed to complete the fabrication of the TFT device.

Particular implementations of the subject matter described in this disclosure can be implemented to realize one or more of the following potential advantages. Implementations of the methods may be used to form a top gate TFT device incorporating an oxide semiconductor with heavily doped n-type regions. Heavily doped n-type regions in the source and drain area of the TFT device reduce contact resistance by lowering the electric barrier in the contact of a heavily doped n-type region of the oxide semiconductor and a contact material; a high parasitic contact resistance can degrade TFT device operation. Other methods of forming heavily doped n-type regions of an oxide semiconductor may not have good doping efficiency or long term reliability. The methods disclosed herein provide a reliable and robust process for forming heavily doped n-type regions of an oxide semiconductor. Further, the insulating metal oxide layer formed on top of a heavily doped n-type region in the methods disclosed herein can provide a barrier against the migration of metal atoms of an electrical contact made to the heavily doped n-type region through a hole etched in the metal oxide layer.

Further, implementations of the methods may be used to form a self-aligned top gate TFT device in which the gate region of the TFT is used as a mask. Self-aligning fabrication processes help to ensure that the gate is in the proper position relative to the source and drain regions of the oxide semiconductor. Self-aligning fabrication processes also do not use lithographic patterning processes in aligning the gate, source region, and drain region of a TFT device, simplifying the process and greatly improving the yield. The yield refers to the percentage of a number of TFT devices on a substrate that function properly. Self-aligning fabrication processes can also minimize the gate to source and gate to drain overlap parasitic capacitances.

An example of a suitable electromechanical systems (EMS) or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity, i.e., by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent interferometric modulators 12. In the IMOD 12 on the left (as illustrated), a movable reflective layer 14 is illustrated in a relaxed position at a predetermined distance from an optical stack 16, which includes a partially reflective layer. The voltage $V_o$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 1, the reflective properties of pixels 12 are generally illustrated with arrows 13 indicating light incident upon the pixels 12, and light 15 reflecting from the IMOD 12 on the left. Although not illustrated in detail, it will be understood by one having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the IMOD 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1000 um, while the gap 19 may be less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the IMOD 12 on the left in FIG. 1, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated IMOD 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
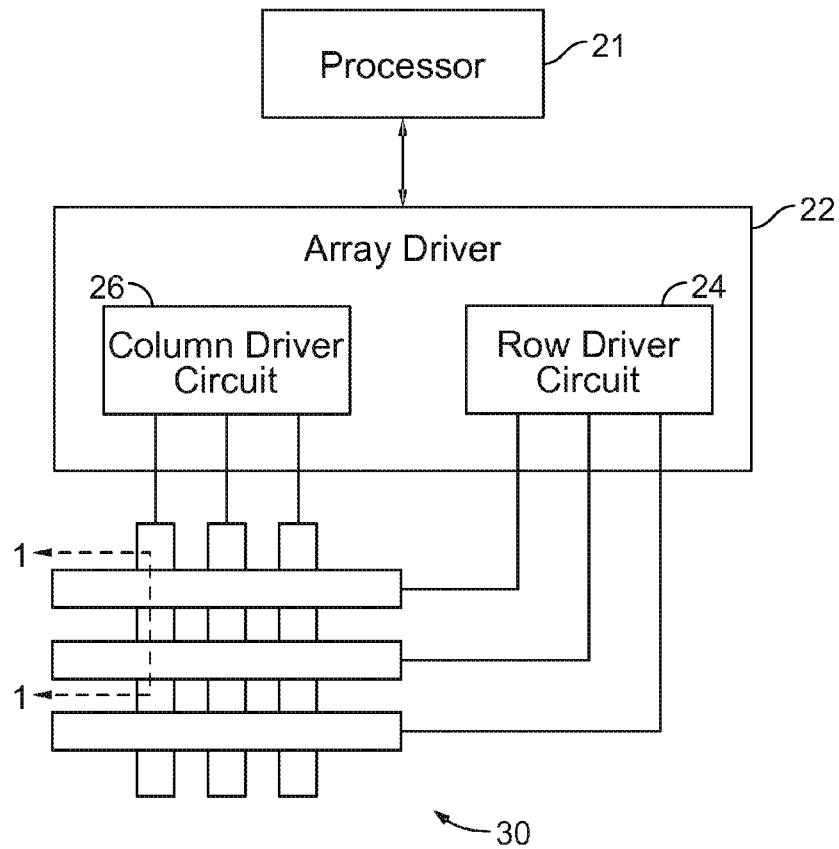
FIG. 2 shows an example of a system block diagram illustrating an electronic device incorporating a 3×3 interferometric modulator display.

FIG. 2 shows an example of a system block diagram illustrating an electronic device incorporating a 3×3 interferometric modulator display. The electronic device includes a processor 21 that may be configured to execute one or more software modules. In addition to executing an operating system, the processor 21 may be configured to execute one or more software applications, including a web browser, a telephone application, an email program, or other software application.

The processor 21 can be configured to communicate with an array driver 22. The array driver 22 can include a row driver circuit 24 and a column driver circuit 26 that provide signals to, e.g., a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
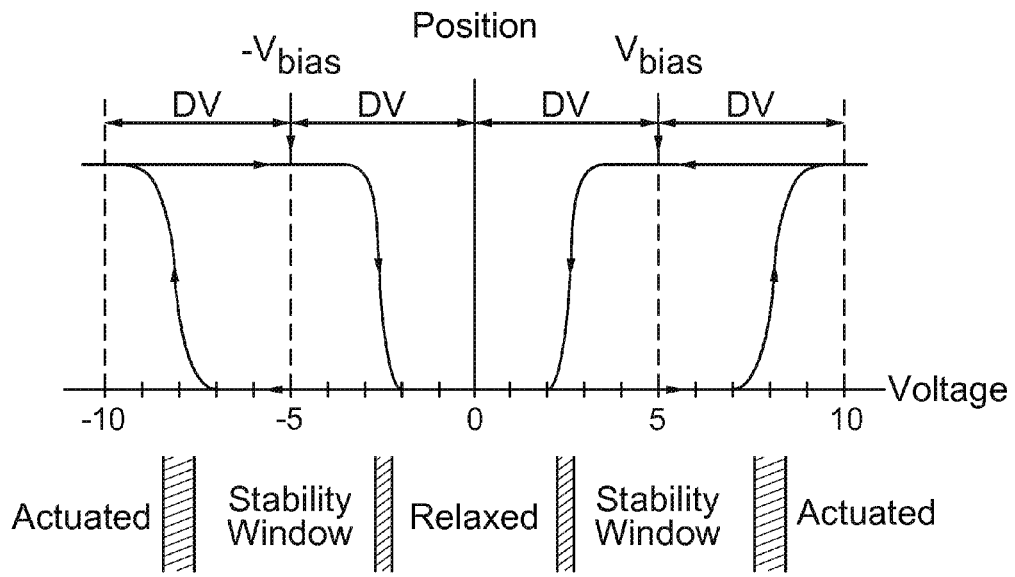
FIG. 3 shows an example of a diagram illustrating movable reflective layer position versus applied voltage for the interferometric modulator of FIG. 1.
FIG. 4 shows an example of a table illustrating various states of an interferometric modulator when various common and segment voltages are applied.

FIG. 3 shows an example of a diagram illustrating movable reflective layer position versus applied voltage for the interferometric modulator of FIG. 1. For MEMS interferometric modulators, the row/column (i.e., common/segment) write procedure may take advantage of a hysteresis property of these devices as illustrated in FIG. 3. An interferometric modulator may require, for example, about a 10-volt potential difference to cause the movable reflective layer, or mirror, to change from the relaxed state to the actuated state. When the voltage is reduced from that value, the movable reflective layer maintains its state as the voltage drops back below, e.g., 10 volts, however, the movable reflective layer does not relax completely until the voltage drops below 2 volts. Thus, a range of voltage, approximately 3 to 7 volts, as shown in FIG. 3, exists where there is a window of applied voltage within which the device is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about 10 volts, and pixels that are to be relaxed are exposed to a voltage difference of near zero volts. After addressing, the pixels are exposed to a steady state or bias voltage difference of approximately 5-volts such that they remain in the previous strobing state. In this example, after being addressed, each pixel sees a potential difference within the "stability window" of about 3-7 volts. This hysteresis property feature enables the pixel design, e.g., illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment" voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an interferometric modulator when various common and segment voltages are applied. As will be readily understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all interferometric modulator elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the interferometric modulator will remain constant. For example, a relaxed IMOD will remain in a relaxed position, and an actuated IMOD will remain in an actuated position. The hold voltages can be selected such that the pixel voltage will remain within a stability window both when the high segment voltage $VS_H$ and the low segment voltage $VS_L$ are applied along the corresponding segment line. Thus, the segment voltage swing, i.e., the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which always produce the same polarity potential difference across the modulators. In some other implementations, signals can be used which alternate the polarity of the potential difference of the modulators. Alternation of the polarity across the modulators (that is, alternation of the polarity of write procedures) may reduce or inhibit charge accumulation which could occur after repeated write operations of a single polarity.

Figure 5A:
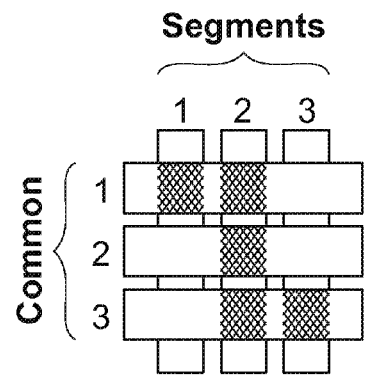
FIG. 5A shows an example of a diagram illustrating a frame of display data in the 3×3 interferometric modulator display of FIG. 2.
Figure 5B:
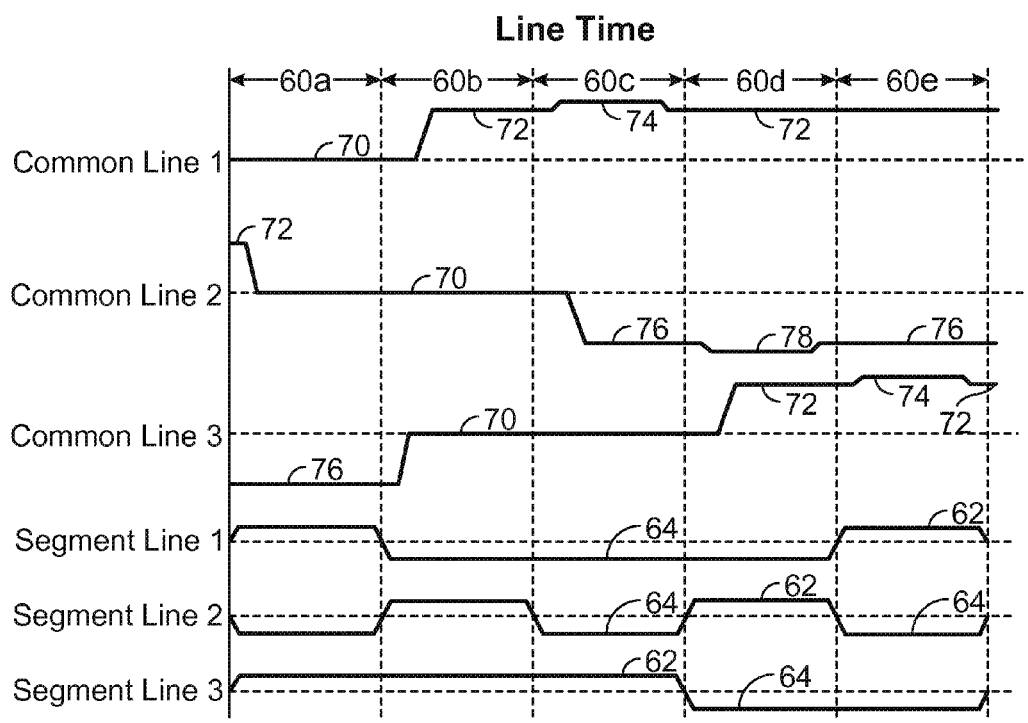
FIG. 5B shows an example of a timing diagram for common and segment signals that may be used to write the frame of display data illustrated in FIG. 5A.

FIG. 5A shows an example of a diagram illustrating a frame of display data in the 3×3 interferometric modulator display of FIG. 2. FIG. 5B shows an example of a timing diagram for common and segment signals that may be used to write the frame of display data illustrated in FIG. 5A. The signals can be applied to the, e.g., 3×3 array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, e.g., a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a, a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the interferometric modulators, as none of common lines 1, 2 or 3 are being exposed to voltage levels causing actuation during line time 60a (i.e., $VC_{REL}$-relax and $VC_{HOLD\_L}$-stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a predefined threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60*d*, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60*e*, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60*e*, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60*a*-60*e*) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the necessary line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
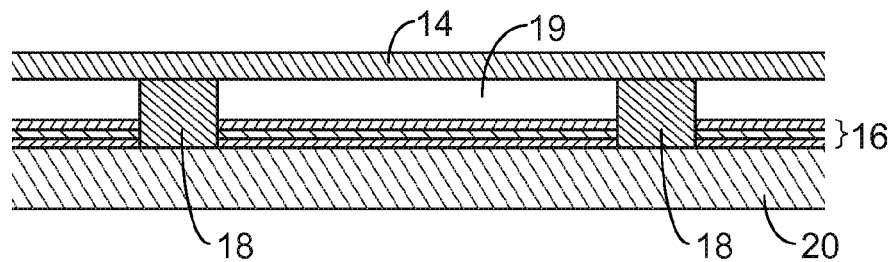
FIG. 6A shows an example of a partial cross-section of the interferometric modulator display of FIG. 1.
Figure 6B:
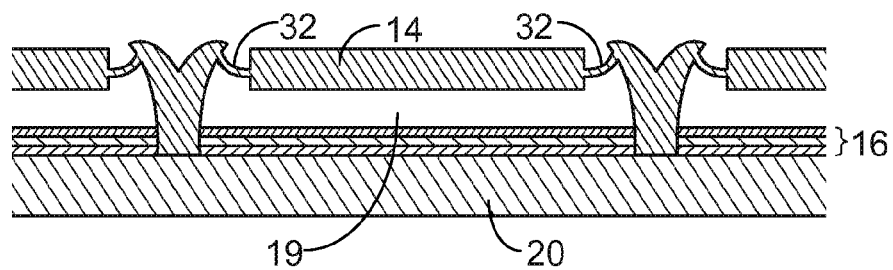
FIGS. 6B-6E show examples of cross-sections of varying implementations of interferometric modulators.
Figure 6C:
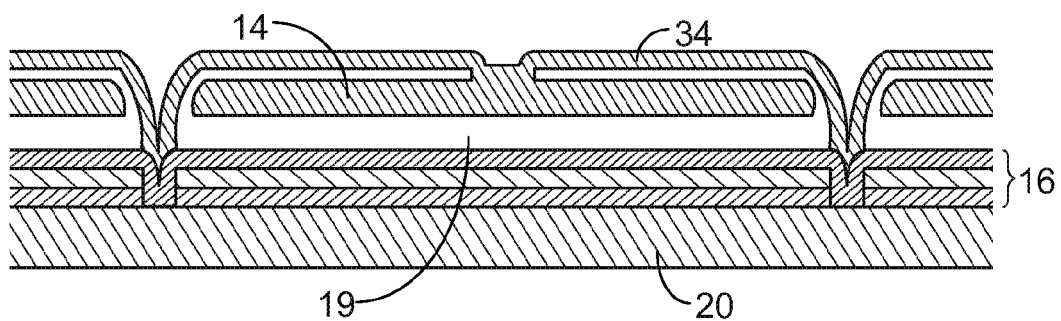

The details of the structure of interferometric modulators that operate in accordance with the principles set forth above may vary widely. For example, FIGS. 6A-6E show examples of cross-sections of varying implementations of interferometric modulators, including the movable reflective layer 14 and its supporting structures. FIG. 6A shows an example of a partial cross-section of the interferometric modulator display of FIG. 1, where a strip of metal material, i.e., the movable reflective layer 14 is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as support posts. The implementation shown in FIG. 6C has additional benefits deriving from the decoupling of the optical functions of the movable reflective layer 14 from its mechanical functions, which are carried out by the deformable layer 34. This decoupling allows the structural design and materials used for the reflective layer 14 and those used for the deformable layer 34 to be optimized independently of one another.

Figure 6D:
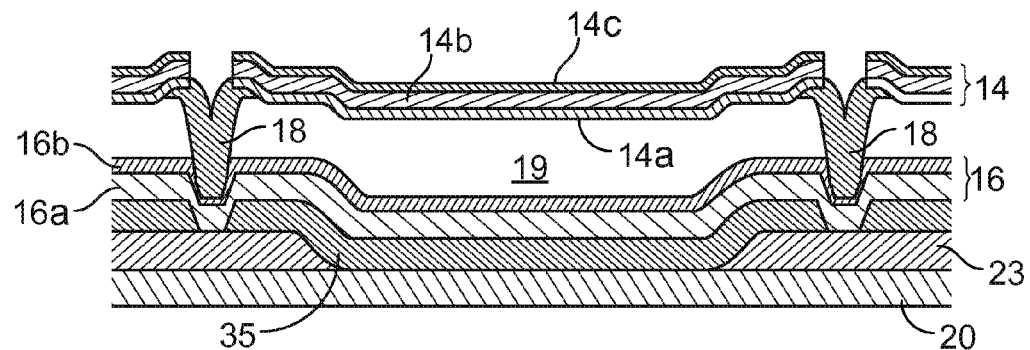

FIG. 6D shows another example of an IMOD, where the movable reflective layer 14 includes a reflective sub-layer 14*a*. The movable reflective layer 14 rests on a support structure, such as support posts 18. The support posts 18 provide separation of the movable reflective layer 14 from the lower stationary electrode (i.e., part of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14*c*, which may be configured to serve as an electrode, and a support layer 14*b*. In this example, the conductive layer 14*c* is disposed on one side of the support layer 14*b*, distal from the substrate 20, and the reflective sub-layer 14*a* is disposed on the other side of the support layer 14*b*, proximal to the substrate 20. In some implementations, the reflective sub-layer 14*a* can be conductive and can be disposed between the support layer 14*b* and the optical stack 16. The support layer 14*b* can include one or more layers of a dielectric material, for example, silicon oxynitride (SiON) or silicon dioxide ($SiO_2$). In some implementations, the support layer 14*b* can be a stack of layers, such as, for example, an $SiO_2$/SiON/$SiO_2$ tri-layer stack. Either or both of the reflective sub-layer 14*a* and the conductive layer 14*c* can include, e.g., an aluminum (Al) alloy with about 0.5% copper (Cu), or another reflective metallic material. Employing conductive layers 14*a*, 14*c* above and below the dielectric support layer 14*b* can balance stresses and provide enhanced conduction. In some implementations, the reflective sub-layer 14*a* and the conductive layer 14*c* can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (e.g., between pixels or under posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, an $SiO_2$ layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, carbon tetrafluoromethane ($CF_4$) and/or oxygen ($O_2$) for the MoCr and $SiO_2$ layers and chlorine ($Cl_2$) and/or boron trichloride (BCl$_3$) for the aluminum alloy layer. In some implementations, the black mask 23 can be an etalon or interferometric stack structure. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate the absorber layer 16a from the conductive layers in the black mask 23.

Figure 6E:
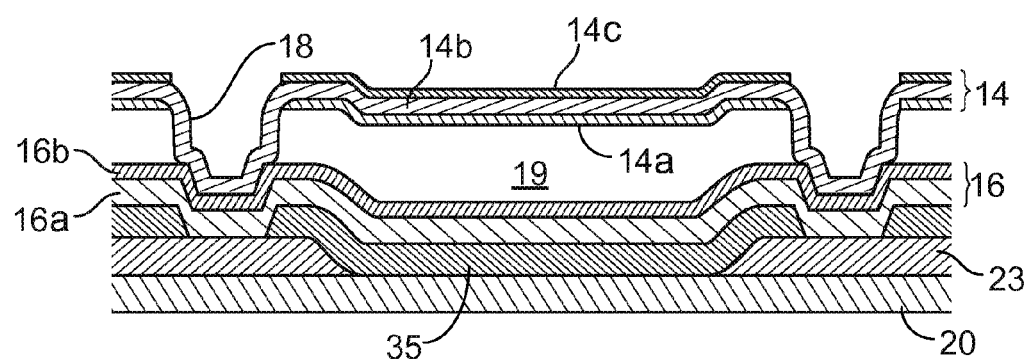

FIG. 6E shows another example of an IMOD, where the movable reflective layer 14 is self supporting. In contrast with FIG. 6D, the implementation of FIG. 6E does not include support posts 18. Instead, the movable reflective layer 14 contacts the underlying optical stack 16 at multiple locations, and the curvature of the movable reflective layer 14 provides sufficient support that the movable reflective layer 14 returns to the unactuated position of FIG. 6E when the voltage across the interferometric modulator is insufficient to cause actuation. The optical stack 16, which may contain a plurality of several different layers, is shown here for clarity including an optical absorber 16a, and a dielectric 16b. In some implementations, the optical absorber 16a may serve both as a fixed electrode and as a partially reflective layer.

In implementations such as those shown in FIGS. 6A-6E, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing. Additionally, the implementations of FIGS. 6A-6E can simplify processing, such as, e.g., patterning.

Figure 7:
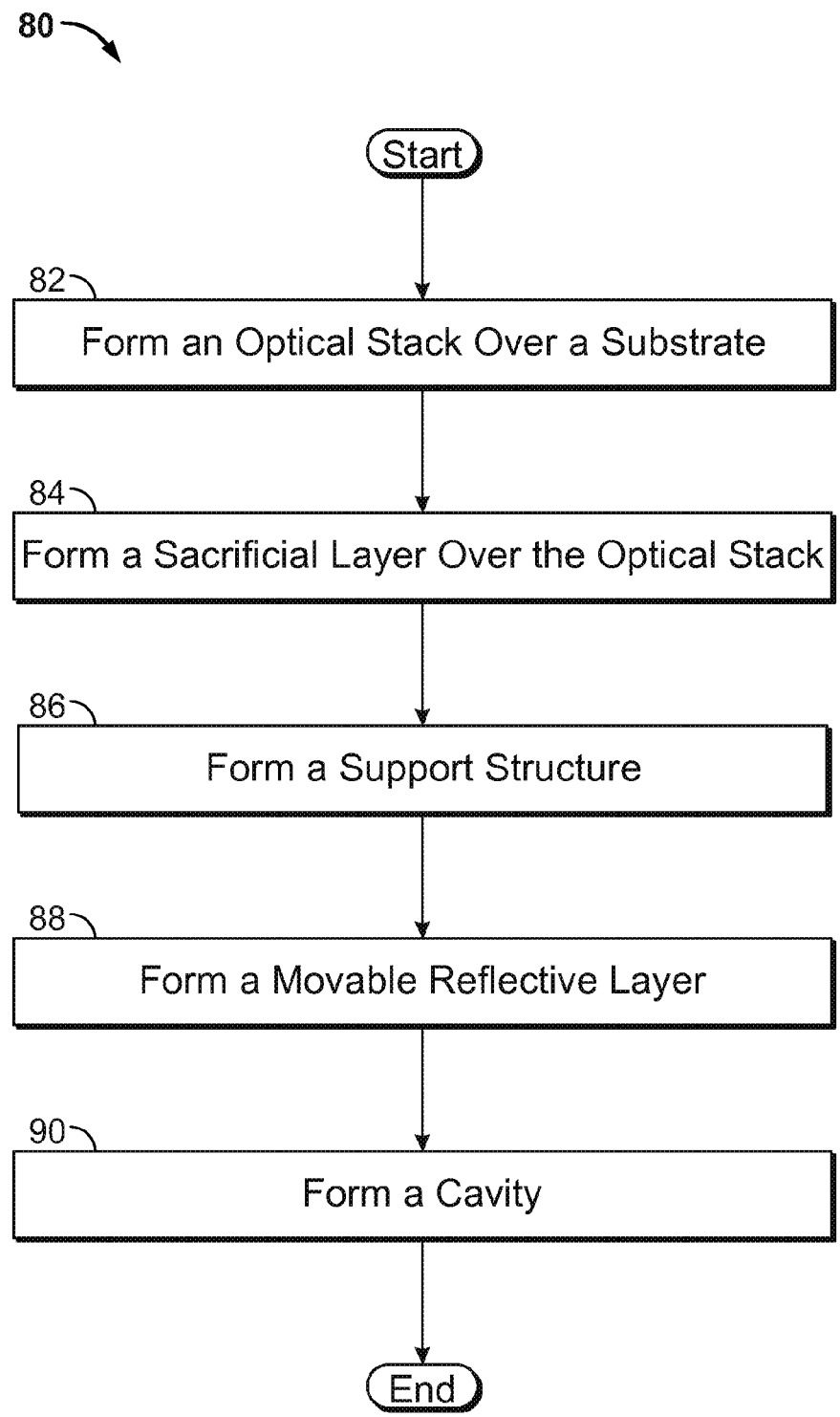
FIG. 7 shows an example of a flow diagram illustrating a manufacturing process for an interferometric modulator.
Figure 8A:
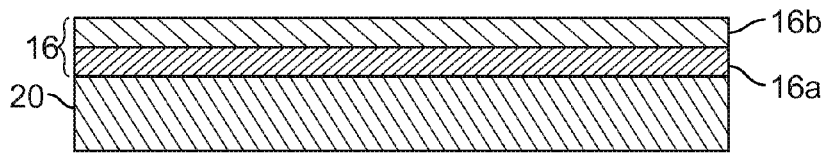
FIGS. 8A-8E show examples of cross-sectional schematic illustrations of various stages in a method of making an interferometric modulator.

FIG. 7 shows an example of a flow diagram illustrating a manufacturing process 80 for an interferometric modulator, and FIGS. 8A-8E show examples of cross-sectional schematic illustrations of corresponding stages of such a manufacturing process 80. In some implementations, the manufacturing process 80 can be implemented to manufacture, e.g., interferometric modulators of the general type illustrated in FIGS. 1 and 6, in addition to other blocks not shown in FIG. 7. With reference to FIGS. 1, 6 and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, e.g., cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display.

Figure 8B:
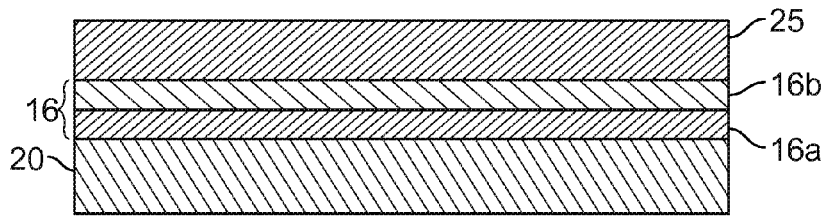

The process 80 continues at block 84 with the formation of a sacrificial layer 25 over the optical stack 16. The sacrificial layer 25 is later removed (e.g., at block 90) to form the cavity 19 and thus the sacrificial layer 25 is not shown in the resulting interferometric modulators 12 illustrated in FIG. 1. FIG. 8B illustrates a partially fabricated device including a sacrificial layer 25 formed over the optical stack 16. The formation of the sacrificial layer 25 over the optical stack 16 may include deposition of a xenon difluoride (XeF$_2$)-etchable material such as molybdenum (Mo) or amorphous silicon (Si), in a thickness selected to provide, after subsequent removal, a gap or cavity 19 (see also FIGS. 1 and 8E) having a desired design size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

Figure 8C:
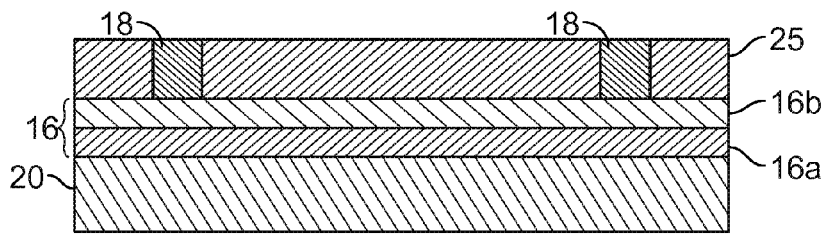

The process 80 continues at block 86 with the formation of a support structure e.g., a post 18 as illustrated in FIGS. 1, 6 and 8C. The formation of the post 18 may include patterning the sacrificial layer 25 to form a support structure aperture, then depositing a material (e.g., a polymer or an inorganic material, e.g., silicon oxide) into the aperture to form the post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning to remove portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a patterning and etching process, but also may be performed by alternative etching methods.

Figure 8D:
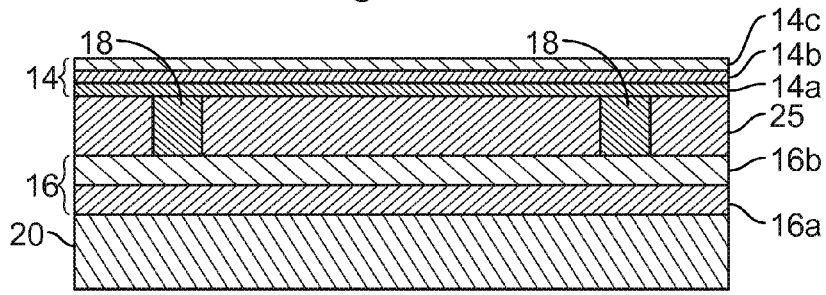
Figure 8E:
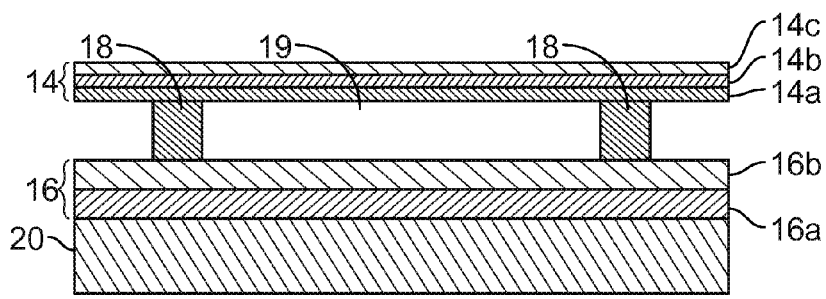

The process 80 continues at block 88 with the formation of a movable reflective layer or membrane such as the movable reflective layer 14 illustrated in FIGS. 1, 6 and 8D. The movable reflective layer 14 may be formed by employing one or more deposition processes, e.g., reflective layer (e.g., aluminum, aluminum alloy) deposition, along with one or more patterning, masking, and/or etching processes. The movable reflective layer 14 can be electrically conductive, and referred to as an electrically conductive layer. In some implementations, the movable reflective layer 14 may include a plurality of sub-layers 14a, 14b, 14c as shown in FIG. 8D. In some implementations, one or more of the sub-layers, such as sub-layers 14a, 14c, may include highly reflective sub-layers selected for their optical properties, and another sub-layer 14b may include a mechanical sub-layer selected for its mechanical properties. Since the sacrificial layer 25 is still present in the partially fabricated interferometric modulator formed at block 88, the movable reflective layer 14 is typically not movable at this stage. A partially fabricated IMOD that contains a sacrificial layer 25 also may be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, e.g., cavity 19 as illustrated in FIGS. 1, 6 and 8E. The cavity 19 may be formed by exposing the sacrificial material 25 (deposited at block 84) to an etchant. For example, an etchable sacrificial material such as Mo or amorphous Si may be removed by dry chemical etching, e.g., by exposing the sacrificial layer 25 to a gaseous or vaporous etchant, such as vapors derived from solid $XeF_2$ for a period of time that is effective to remove the desired amount of material, typically selectively removed relative to the structures surrounding the cavity 19. Other combinations of etchable sacrificial material and etching methods, e.g. wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

As noted above, hardware and data processing apparatus may be associated with electromechanical systems, including IMOD devices. Such hardware and data processing apparatus may include a thin film transistor (TFT) device or devices.

Figure 9A:
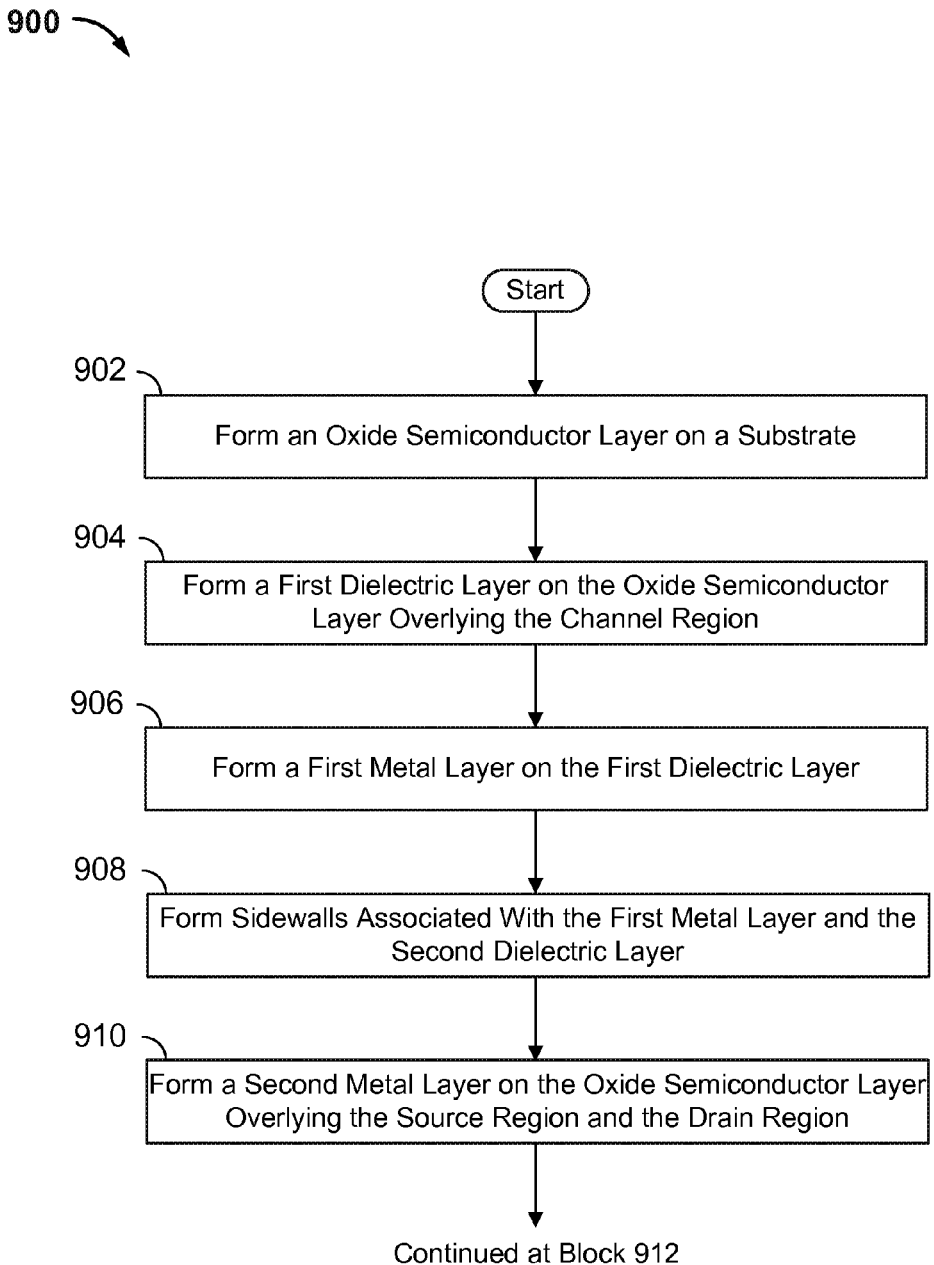
FIGS. 9A and 9B show an example of a flow diagram illustrating a manufacturing process for a thin film transistor device.
Figure 9B:
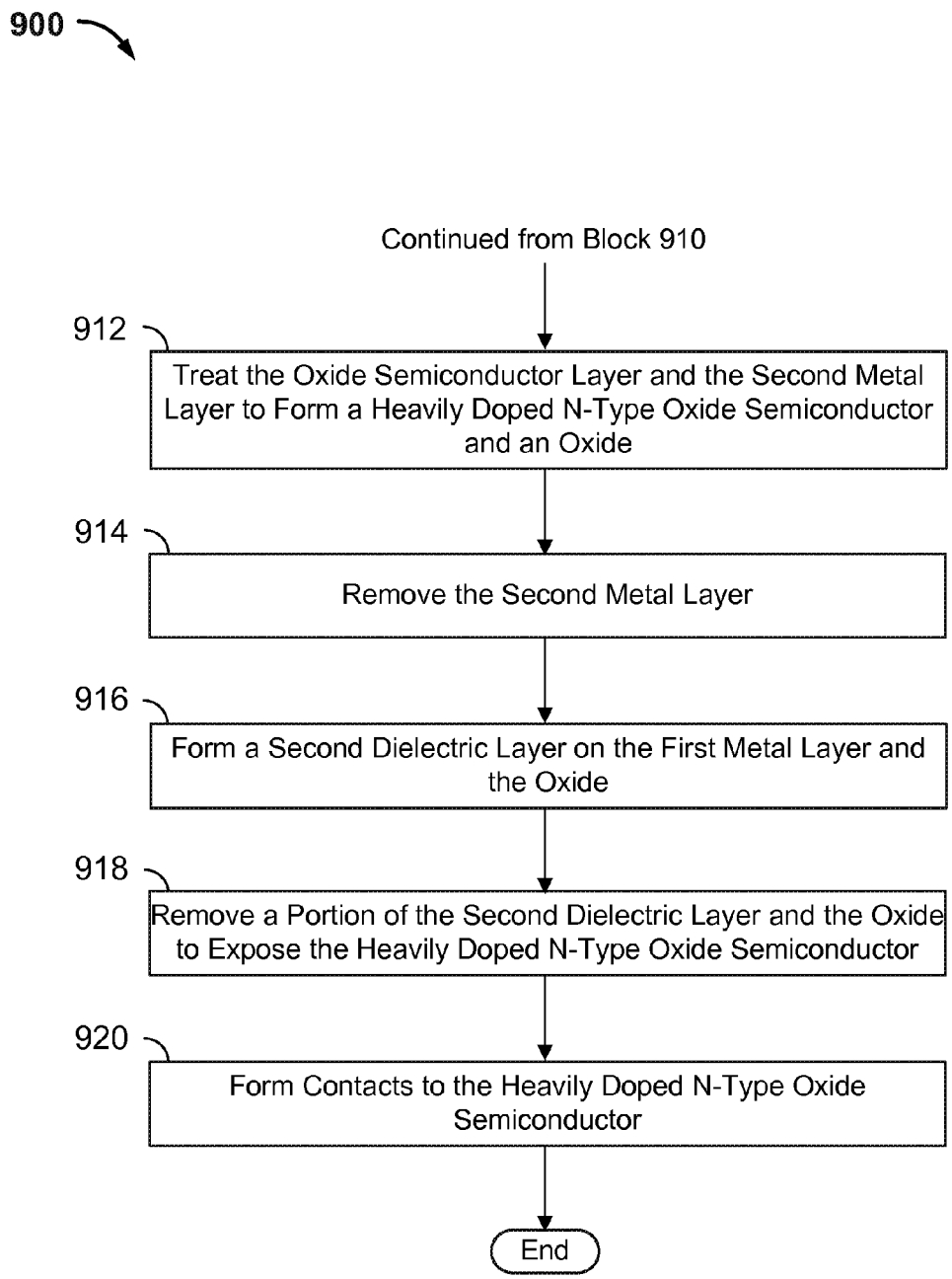

FIGS. 9A and 9B show an example of a flow diagram illustrating a manufacturing process for a thin film transistor device. A manufacturing process for a TFT device is also described in the example of a flow diagram shown in FIG. 12, in which some process operations shown in FIG. 9 are condensed and/or omitted. FIGS. 10A-10E show examples of cross-sectional schematic illustrations of various stages in a method of making a thin film transistor device.

At block 902 of the process 900, an oxide semiconductor layer is formed on a substrate. The substrate may be any number of different substrate materials, including transparent materials and non-transparent materials. In some implementations, the substrate is silicon, silicon-on-insulator (SOI), or a glass (e.g., a display glass or a borosilicate glass). In some implementations, the substrate on which the TFT device is fabricated has dimensions of a few microns to hundreds of microns.

The substrate includes a source region, a channel region, and a drain region. These are regions over which the source, channel, and drain of the TFT device will eventually be formed. The channel region is the region of the substrate over which the gate of the TFT will eventually be formed, with the source region and the drain region being the regions over which the source and drain will eventually be formed. The channel region is between the source region and the drain region, and in some implementations connects these regions. It should be noted that in some implementations, these regions are defined at least in part by formation of the gate metal of the TFT, with the region of the substrate underlying and aligned with the gate metal defined as the channel region of the substrate.

In some implementations, a surface of the substrate on which the TFT device is fabricated includes a buffer layer. The buffer layer may serve as an insulation surface. In some implementations, the buffer layer is an oxide, such as silicon oxide ($SiO_2$) or aluminum oxide ($Al_2O_3$). In some implementations, the buffer layer is about 100 to 1000 nanometers (nm) thick. The oxide semiconductor layer is formed over at least the source region, channel region, and drain region of the substrate and will eventually form the channel as well as the n-doped source and drain areas of the TFT device and may be any number of different oxide semiconductor materials. In some implementations, the oxide semiconductor is an amorphous oxide semiconductor, including indium (In)-containing, zinc (Zn)-containing, tin (Sn)-containing, hafnium (Hf)-containing, and gallium (Ga)-containing oxide semiconductors. Specific examples of amorphous oxide semiconductors include InGaZnO, InZnO, InHfZnO, InSnZnO, SnZnO, InSnO, GaZnO, and ZnO. In some implementations, an oxide semiconductor layer is formed with a physical vapor deposition (PVD) process. PVD processes include pulsed laser deposition (PLD), sputter deposition, electron beam physical vapor deposition (e-beam PVD), and evaporative deposition. In some implementations, the oxide semiconductor layer is about 10 to 100 nm thick.

At block 904, a first dielectric layer is formed on the oxide semiconductor layer. In some implementations, the first dielectric layer is formed only on the portion of the oxide semiconductor layer overlying the channel region. The first dielectric layer may be any number of different dielectric materials. In some implementations, the first dielectric layer is silicon dioxide ($SiO_2$), aluminum oxide ($Al_2O_3$), hafnium oxide ($HfO_2$), titanium oxide ($TiO_2$), silicon oxynitride (SiON), or silicon nitride (SiN). In other implementations, the first dielectric layer includes two or more layers of different dielectric materials arranged in a stacked structure. The first dielectric layer may be formed using deposition processes as known by a person having ordinary skill in the art, including physical vapor deposition (PVD) processes, chemical vapor deposition (CVD) processes including plasma enhanced chemical vapor deposition (PECVD) processes, and atomic layer deposition (ALD) processes. In some implementations, the first dielectric layer is about 50 to 500 nm thick. The first dielectric layer may serve as a gate insulator in the TFT device.

At block 906, a first metal layer is formed on the first dielectric layer. The first metal layer may be any number of different metals, including aluminum (Al), copper (Cu), molybdenum (Mo), tantalum (Ta), chromium (Cr), neodymium (Nd), tungsten (W), titanium (Ti), and an alloy containing any of these elements. In some implementations, the first metal layer includes two or more layers of different metals arranged in a stacked structure. The first metal layer may be formed using deposition processes as known by a person having ordinary skill in the art, including physical vapor deposition (PVD) processes, chemical vapor deposition (CVD) processes, and atomic layer deposition (ALD) processes. As noted above, PVD processes include pulsed laser deposition (PLD) and sputter deposition.

In some implementations, the first dielectric layer and/or the first metal layer is formed on the portion of the oxide semiconductor layer overlying the source region, the channel region, and the drain region. In these implementations, the first dielectric layer and/or the first metal may be patterned with photoresists as known by a person having ordinary skill in the art. The first dielectric layer and/or the first metal layer may then be etched using etching processes as known by a person having ordinary skill in the art. These operations may remove the portions of the first dielectric layer and the first metal layer overlying the source region and the drain region.

Figure 10A:
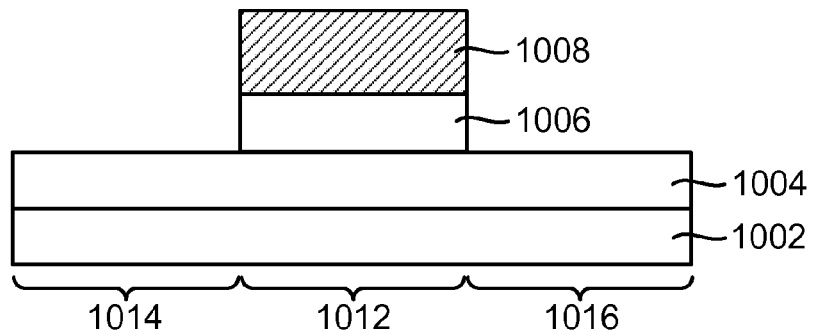
FIGS. 10A-10E show examples of cross-sectional schematic illustrations of various stages in a method of making a thin film transistor device.

FIG. 10A shows an example of the TFT device at this point (e.g., up to the block 906) in the method 900. The TFT device includes a substrate 1002, an oxide semiconductor layer 1004, a first dielectric layer 1006, and a first metal layer 1008. The substrate includes a source region 1014, a channel region 1012, and a drain region 1016. The channel region 1012 is aligned with the first dielectric layer 1006 and first metal layer 1008. As discussed further below, the channel region may or may not be aligned with the channel of the TFT device according to the desired implementation.

Returning to FIG. 9A, at block 908 dielectric sidewalls associated with the first metal layer and the first dielectric layer are formed. The dielectric sidewalls may be formed with any number of different dielectric materials. In some implementations, the dielectric sidewalls are the same dielectric material as the first dielectric layer, including $SiO_2$, $Al_2O_3$, $HfO_2$, $TiO_2$, SiON, and SiN.

In some implementations, the dielectric sidewalls are formed by depositing the dielectric sidewall material on the oxide semiconductor layer overlying the source region and the drain region and on the first metal layer. An anisotropic etch process may then be used to remove the dielectric sidewall material from the first metal layer and portions of the oxide semiconductor layer overlying the source region and the drain region. A portion of the oxide semiconductor layer overlying the source region and the drain region and the sides of the first dielectric layer and the first metal layer may be left covered by the dielectric sidewall material.

In some implementations, the anisotropic etch process is a reactive ion etch (RIE) process in which a radio frequency (RF) bias is applied to the substrate to create directional electric fields near the substrate. The directional electric fields near the substrate yield anisotropic etch profiles, in some implementations.

Figure 10B:
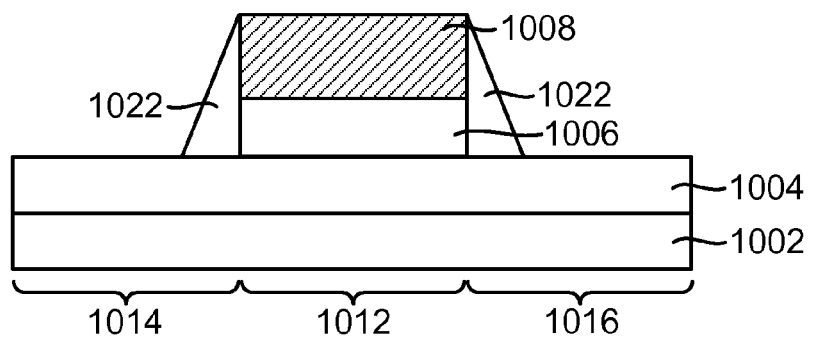

FIG. 10B shows an example of the TFT device at this point (e.g., up to the block 908) in the method 900. The TFT device includes dielectric sidewalls 1022. As shown in FIG. 10B, the dielectric sidewalls 1022 are on either side of the first dielectric layer 1006 and the first metal layer 1008. The dielectric sidewalls 1022 also cover a portion of the oxide semiconductor layer 1004 overlying the source region 1014 and the drain region 1016.

The dielectric sidewalls 1022 affect the resistance of the TFT device. For example, as shown in FIG. 10D, described below, small regions 1043 and 1045 of the oxide semiconductor layer on either side of the channel region 1012 are not underlying the first dielectric layer 1006 and the first metal layer 1008. Further, the small regions 1043 and 1045 of the oxide semiconductor are not converted to a heavily doped n-type oxide semiconductor. These regions 1043 and 1045 can increase the resistance of the TFT device.

In some implementations of the method 900, the dielectric sidewalls serve to increase the yield. As noted above, the yield refers to the percentage of a number of TFT devices on a substrate that function properly. The dielectric sidewalls can improve the conformal step coverage of the second metal layer, in some implementations. The dielectric sidewalls can also reduce shorting between the first metal layer and the source contact or the drain contact, in some implementations. In some other implementations of the method 900, dielectric sidewalls are not formed. A TFT device having no dielectric sidewalls exhibits better performance characteristics, in some implementations, due its lower resistance.

At block 910, a second metal layer is formed on the exposed oxide semiconductor layer overlying the source region and the drain region. Photolithography techniques, as known by a person having ordinary skill in the art, may be used in some implementations to prevent the second metal from being formed on the dielectric sidewalls and the first metal layer. In some other implementations, the second metal layer is also formed on the dielectric sidewalls, if present, and the first metal layer.

In some implementations, the metal of the second metal layer is titanium (Ti), manganese (Mn), or magnesium (Mg). In some implementations, the metal of the second metal layer is a metal that forms an oxide having a lower Gibbs free energy than the Gibbs free energies of the oxides in the oxide semiconductor layer. The second metal layer may be formed using deposition processes as known by a person having ordinary skill in the art, including physical vapor deposition (PVD) processes, chemical vapor deposition (CVD) processes, and atomic layer deposition (ALD) processes. In some implementations in which the second metal layer is formed using a PVD process, the PVD process is sputter deposition, e-beam PVD, or evaporative deposition.

Figure 10C:
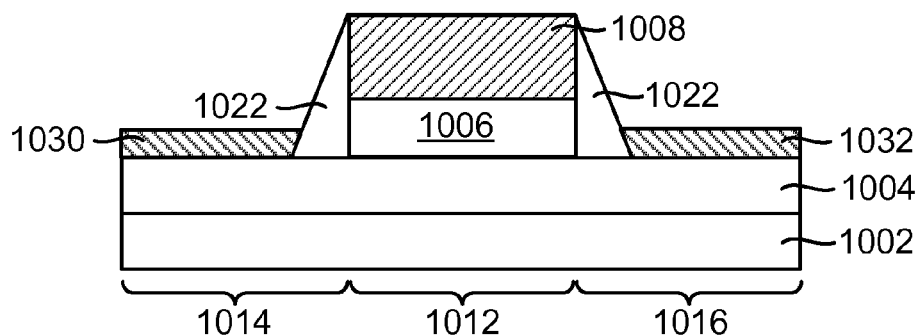
Figure 10D:
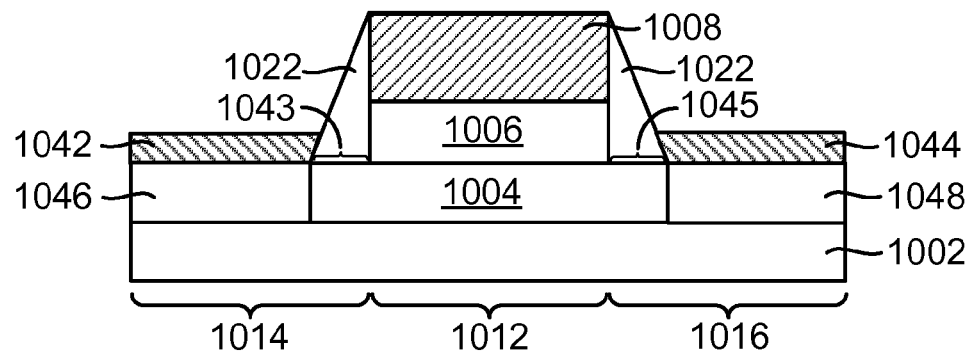

FIG. 10C shows an example of the TFT device at this point (e.g., up to the block 910) in the method 900. The TFT device includes second metal layers 1030 and 1032. As shown in FIG. 10C, the second metal layers 1030 and 1032 are formed on the oxide semiconductor layer 1004 overlying the source region 1014 and the drain region 1016. In the depicted example, the second metal layers 1030 and 1032 are not precisely aligned with the source region 1014 and the drain region 1016 of the substrate due to the presence of the dielectric sidewalls 1022. In some other implementations, the second metal layer is also formed on the dielectric sidewalls 1022 and the first metal layer 1008.

At block 912, the oxide semiconductor layer and the second metal layer are treated to form a heavily doped n-type oxide semiconductor and an oxide. The treatment forms a heavily doped n-type oxide semiconductor in the oxide semiconductor layer overlying the source region and the drain region. The treatment also forms an oxide in the second metal layer on the oxide semiconductor layer overlying the source region and the drain region.

In some implementations, the treatment causes oxygen in the oxide semiconductor layer overlying the source region and the drain region to diffuse into the second metal layer. The diffusion of oxygen out of the oxide semiconductor layer creates oxygen vacancies in these regions of the oxide semiconductor layer. The oxygen vacancies may act as electron donors, and create a heavily doped n-type oxide semiconductor in the oxide semiconductor overlying the source region and the drain region.

In some implementations, the diffusion of oxygen into the second metal layer forms an oxide in the second metal layer overlying the source region and the drain region. In some implementations, substantially all of the second metal layer on the oxide semiconductor layer overlying the source region and the drain region is oxidized. In some other implementations, a portion of the second metal layer contacting the oxide semiconductor layer is oxidized, and some metal on top of the metal oxide is not oxidized.

In some implementations, as noted above, a metal of the second metal layer forms an oxide having a lower Gibbs free energy than the oxides in the oxide semiconductor layer. The lower Gibbs free energy of an oxide of the second metal layer may provide a thermodynamic driving force for the diffusion of oxygen out of the oxide semiconductor layer.

In some implementations, the treatment to form the metal oxide and the heavily doped n-type oxide semiconductor includes a heat treatment. The temperature and the duration of a heat treatment are controlled so as not to damage components in the partially fabricated TFT device. For example, in some implementations, the heat treatment is performed at a temperature of about 200° C. to 500° C. for a duration of about 30 minutes to 10 hours. In some implementations, the heat treatment is at a temperature of about 200° C. to 250° C. for a duration of about 30 min to 1 hour. In some implementations, the heat treatment is performed in a nitrogen atmosphere, a forming gas (i.e., a mixture of hydrogen and nitrogen) atmosphere, or in vacuum.

In some other implementations, the heat treatment includes a rapid thermal annealing (RTA) treatment in a controlled ambient atmosphere. In some implementations, the heat treatment is a laser annealing treatment at about 250 to 400° C. for about 1 millisecond to 3 seconds.

The temperature of the heat treatment depends on the thermodynamics of the metal of the second metal layer, the metal oxide, and the oxides of the oxide semiconductor layer. The duration of the heat treatment depends on the kinetics of oxygen diffusion out of the oxide semiconductor and into the second metal layer. Generally, due to these thermodynamic and kinetic considerations, a shorter duration heat treatment may be used with a higher temperature heat treatment.

In one experiment, a 70 nm thick InGaZnO semiconductor layer was formed on a silicon oxide substrate. A 50 nm thick Ti layer was deposited on the InGaZnO semiconductor layer. This structure was annealed in a nitrogen atmosphere at about 300° C. for about 2 hours. At the Ti/InGaZnO semiconductor interface, a metal oxide layer about 10 nm thick was formed, as observed with a transmission electron microscope (TEM). Assuming that each titanium atom in the 10 nm thick metal oxide layer combines with two oxygen atoms from the InGaZnO semiconductor layer, the electron density in the InGaZnO semiconductor layer would be about $10^{21}$ electrons per $cm^3$. This electron density in the InGaZnO semiconductor layer can create a highly doped n-type oxide semiconductor.

Controlling the amount of oxygen that diffuses out of the oxide semiconductor layer may be used to control the level of doping in the oxide semiconductor layer, as oxygen atom vacancies formed when oxygen diffuses out of the oxide semiconductor can serve as electron donors. In some implementations, the temperature and the duration of the heat treatment are controlled to control the amount of oxygen diffusion out of the oxide semiconductor layer and into the second metal layer. For example, more oxygen can diffuse out of the oxide semiconductor layer with higher temperature and/or longer duration heat treatments.

In some other implementations, the thickness of the second metal layer may be used to control the amount of oxygen diffusion out of the oxide semiconductor layer and into the second metal layer. For example, once all of the second metal layer on the oxide semiconductor layer overlying the source region and the drain region is oxidized, very little additional or substantially no more oxygen will diffuse out of the oxide semiconductor layer. Thus, the thickness of the second metal layer may be used to control the amount of oxygen that diffuses out of the oxide semiconductor layer.

At block 914, the second metal layer is removed. In some implementations, only portions of the second metal layer that are not oxidized are removed. For example, when a portion of the second metal layer contacting the oxide semiconductor layer is oxidized and some metal on top of the metal oxide is not oxidized, this remaining metal on top may be removed. As another example, any portion of the second metal layer that is formed on the first metal layer and/or on the dielectric sidewalls may remain un-oxidized after the treatment and may be removed. Wet and dry etching processes as known by a person having ordinary skill in the art may be used to remove the second metal. Dry etching processes include reactive ion etching (RIE) and vapor phase etching. In some implementations, the second metal layer overlying the source region and the drain region is completely oxidized and there is not a second metal layer to remove.

FIG. 10D shows an example of the TFT device at this point (e.g., up to the block 914) in the method 900. The TFT device includes heavily doped n-type oxide semiconductor layers 1046 and 1048 overlying the source region 1014 and the drain region 1016. These heavily doped n-type oxide semiconductor layers 1046 and 1048 serve as a source and a drain in a TFT device. The oxide semiconductor layer 1004 not converted to a heavily doped n-type oxide semiconductor serves as a channel in a TFT device. As noted above, small regions 1043 and 1045 of the oxide semiconductor layer 1004 on either side of the channel region 1012 are not under the first dielectric layer 1006 and the first metal layer 1008. These regions 1043 and 1045 may increase the resistance of the TFT device.

The TFT device also includes an oxide layer 1042 overlying the source region 1014 and an oxide layer 1044 overlying the drain region 1016. The oxide layers 1042 and 1044 are a metal oxide formed from the metal of the second metal layers 1030 and 1032 reacting with oxygen from the oxide semiconductor layer 1004. In some implementations, the oxide layers 1042 and 1044 can act as passivation insulators. In other implementations, the oxide layers 1042 and 1044 are removed.

At block 916, a second dielectric layer is formed on the first metal layer and the oxide. The second dielectric layer may be any number of different dielectric materials. In some implementations, the second dielectric layer is the same dielectric material as the first dielectric layer, including $SiO_2$, $Al_2O_3$, $HfO_2$, and SiN. The second metal layer may be formed using deposition processes as known by a person having ordinary skill in the art, including physical vapor deposition (PVD) processes, chemical vapor deposition (CVD) processes, and atomic layer deposition (ALD) processes. In some implementations, the second dielectric layer is about 100 to 500 nm thick. In some implementations, the second dielectric layer acts as a passivation insulator. A passivation insulator can serve as a layer that protects the TFT device from the external environment. A passivation insulator can also provide insulation between the first metal layer and the source contact or the drain contact.

At block 918, a portion of the second dielectric layer and the oxide layers are removed to expose the heavily doped n-type oxide semiconductor. The heavily doped n-type oxide semiconductor overlying the source region and the heavily doped n-type oxide semiconductor overlying the drain region may be exposed, for example. Photoresists with wet or dry etching processes as known by a person having ordinary skill in the art may be used to expose the heavily doped n-type oxide semiconductor overlying the source region and the drain region.

At block 920, contacts to the heavily doped n-type oxide semiconductor overlying the source region and the drain region are formed. The contacts may be any number of different metals, including Al, Cu, Mo, Ta, Cr, Nd, W, Ti, and an alloy containing any of these elements. In some implementations, the contacts include two or more different metals arranged in a stacked structure. The contacts also may be a conductive oxide, such as indium tin oxide (ITO). The contacts may be formed using deposition processes as known by a person having ordinary skill in the art, including physical vapor deposition (PVD) processes, chemical vapor deposition (CVD) processes, and atomic layer deposition (ALD) processes.

Figure 10E:
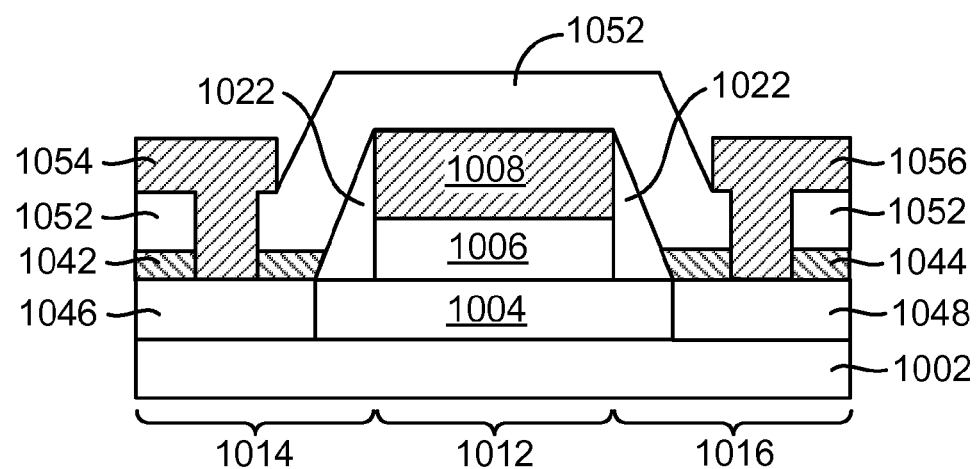

FIG. 10E shows an example of the fabricated TFT device. The TFT device includes a second dielectric layer 1052, a source contact 1054, and a drain contact 1056. The second dielectric layer 1052 acts as a passivation insulator.

The method 900 may be used to fabricate a self-aligned TFT device. The term self-aligned refers to the first dielectric layer and the first metal layer masking the channel region. Then, the source region and the drain region are defined by the regions on which the second metal layer is formed.

Alternatively, in some implementations, a mask may be used to define the source region, the channel region, and the drain region. For example, instead of depositing the first dielectric layer and the first metal layer in blocks 904 and 906, photoresist is deposited over the channel region. Then, the second metal layer is deposited on the oxide semiconductor layer overlying the source region and the drain region and treated to form a heavily doped n-type oxide semiconductor. After forming a heavily doped n-type oxide semiconductor in the source region and drain region, the mask may be removed and the first dielectric layer and a first metal layer may be formed on the channel region. There may be misalignment in the photolithography processes defining the channel region on which the first dielectric layer and a first metal layer are formed, however. In implementations of the self-aligned TFT device fabrication process of the method 900, such misalignment is not an issue.

Figure 11A:
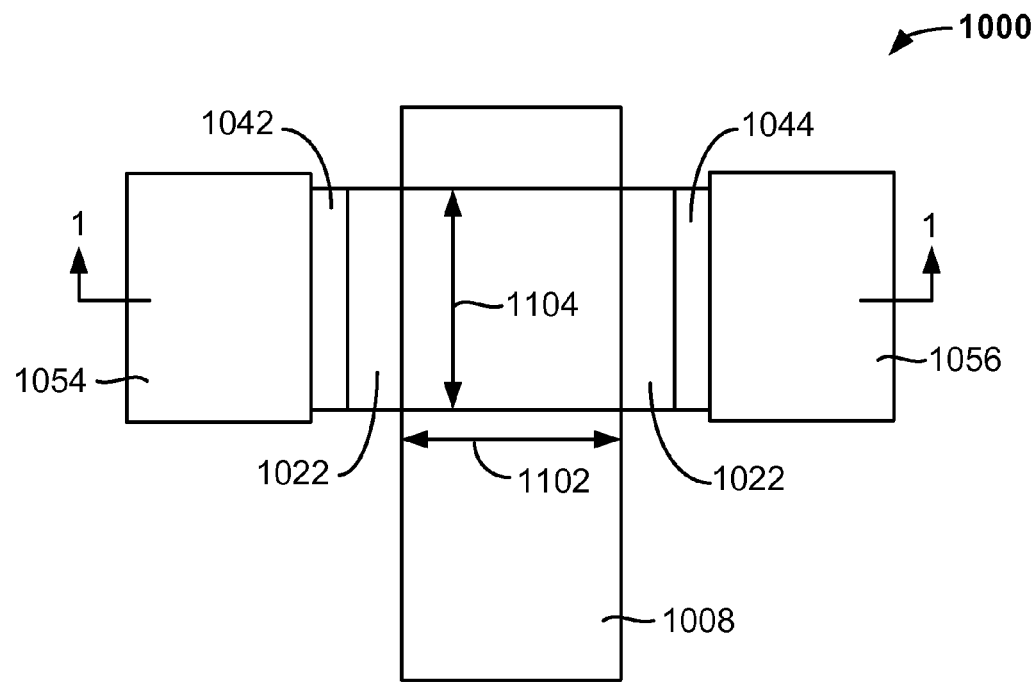
FIGS. 11A-11C show examples of varying implementations of thin film transistor devices.
Figure 11B:
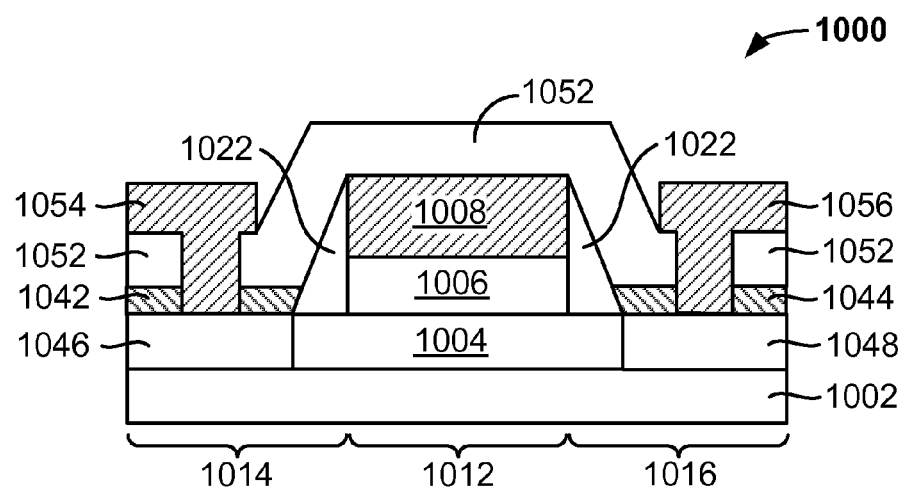
Figure 11C:
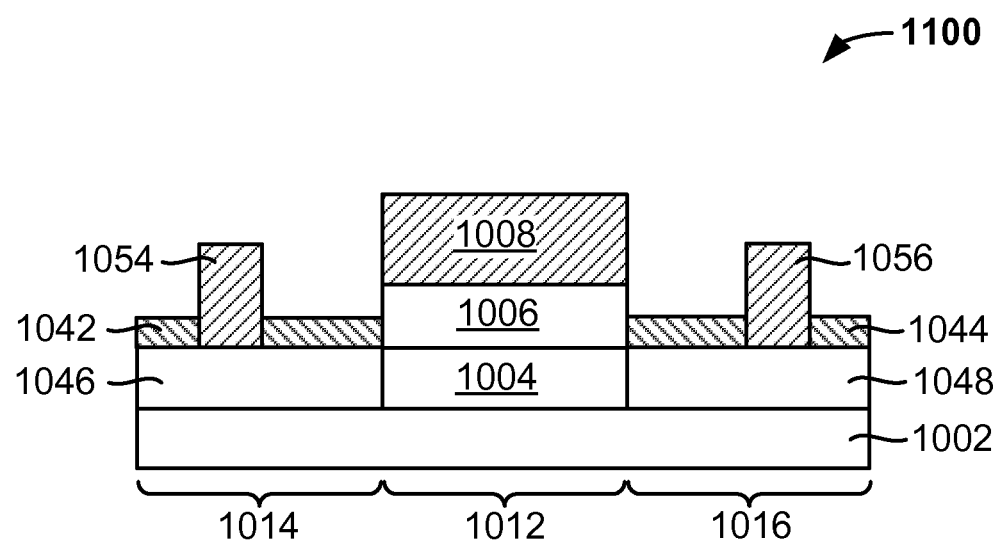

FIGS. 11A-11C show examples of varying implementations of thin film transistor devices. FIG. 11A shows an example of a top down view of a TFT device 1000. FIG. 11B shows a cross-sectional schematic view of the TFT device 1000 through line 1-1 of FIG. 11A; the TFT device 1000 shown in FIGS. 11A and 11B is the same TFT device shown in FIG. 10E.

As noted above, the TFT device 1000 shown in FIG. 11B includes the substrate 1002, the oxide semiconductor layer 1004, dielectric sidewalls 1022, and the heavily doped n-type oxide semiconductor layers 1046 and 1048. On top of the oxide semiconductor layer 1004 are the first dielectric layer 1006 and the first metal layer 1008. On the heavily doped n-type oxide semiconductor layer 1046 is the oxide layer 1042; the source contact 1054 contacts the heavily doped n-type oxide semiconductor layer 1046. On the heavily doped n-type oxide semiconductor layer 1048 is the oxide layer 1044; the drain contact 1056 contacts the heavily doped n-type oxide semiconductor layer 1048. The oxide semiconductor layer 1004, between the heavily doped n-type oxide semiconductor layers 1046 and 1048, forms the channel of the TFT device 1000. The heavily doped n-type oxide semiconductor layer 1046 forms the source of the TFT device 1000, and the heavily doped n-type oxide semiconductor layer 1048 forms the drain of the TFT device 1000. The second dielectric layer 1052 acts as a passivation insulator.

The top down view of the TFT device 1000 shown in FIG. 11A does not show the second dielectric layer 1052. Shown in FIG. 11A are the source contact 1054, the oxide layer 1042, the oxide layer 1044, and the drain contact 1056. Also shown are the dielectric sidewalls 1022 and the first metal layer 1008. The dimension 1102 of the first metal layer is about 50 nm to a few tens of micrometers, in some implementations. The dimension 1104 of the TFT device 1000 is about 50 nm to a few millimeters, in some implementations.

FIG. 11C shows another example of a cross-sectional schematic illustration of a TFT device. The TFT device 1100 shown in FIG. 11C is partially fabricated and does not include dielectric sidewalls. The TFT device 1100 includes the substrate 1002, the oxide semiconductor layer 1004, and the heavily doped n-type oxide semiconductor layers 1046 and 1048. On top of the oxide semiconductor layer 1004 are the first dielectric layer 1006 and the first metal layer 1008. On top of the heavily doped n-type oxide semiconductor layers 1046 and 1048 are the oxide layers 1042 and 1044, respectively. Contacting the heavily doped n-type oxide semiconductor layers 1046 and 1048 are the source contact 1054 and the drain contact 1056, respectively. The oxide semiconductor layer 1004, between the heavily doped n-type oxide semiconductor layers 1046 and 1048, forms the channel of the TFT device 1000. The heavily doped n-type oxide semiconductor layer 1046 forms the source of the TFT device 1000, and the heavily doped n-type oxide semiconductor layer 1048 forms the drain of the TFT device 1000.

Figure 12:
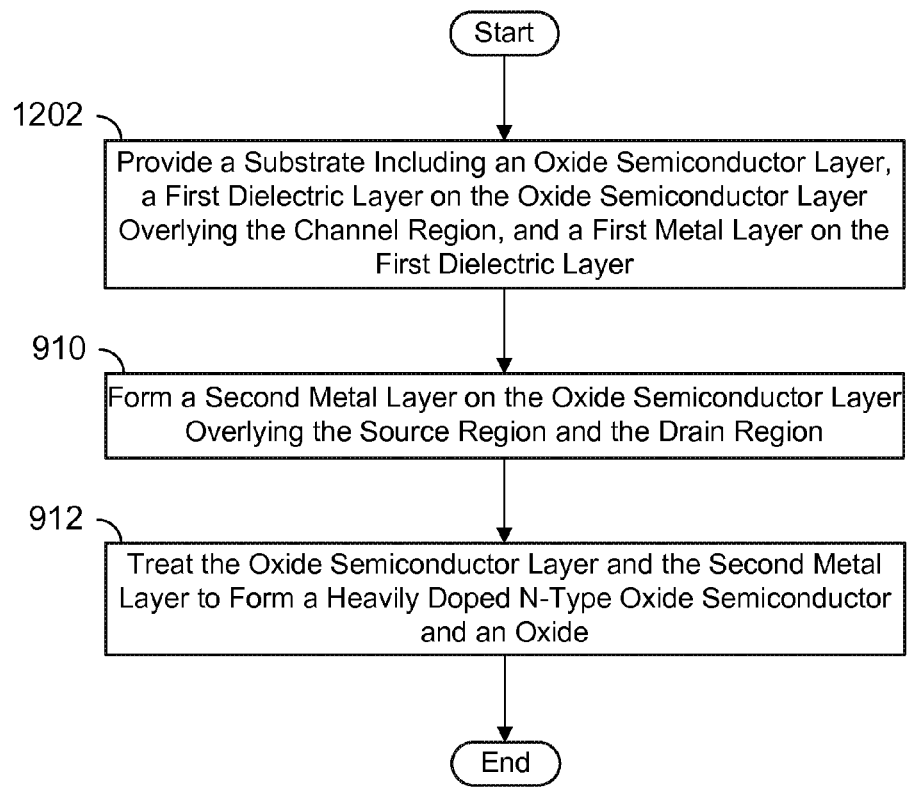
FIGS. 12 and 13 show examples of a flow diagram illustrating a manufacturing process for a thin film transistor device.

FIG. 12 shows an example of a flow diagram illustrating a manufacturing process for a thin film transistor device. The method 1200 shown in FIG. 12 is similar to the method 900 shown in FIG. 9, with some process operations shown in FIG. 9 being condensed and/or omitted.

At block 1202, a substrate is provided. The substrate has a surface including a source region, a drain region, and a channel region. The channel region is between the source region and the drain region. The substrate may be any number of different substrate materials, as described above.

The substrate includes an oxide semiconductor layer on the surface. A first dielectric layer is on the oxide semiconductor layer overlying the channel region. A first metal layer is on the first dielectric layer. The oxide semiconductor of the oxide semiconductor layer may be any of the oxide semiconductors described above. The dielectric of the first dielectric layer may be any of the dielectrics described above. The metal of the first metal layer may be any of the metals described above.

The method 1200 continues with process operations described above with respect to the method 900. At block 910, a second metal layer is formed on the oxide semiconductor layer overlying the source region and the drain region. At block 912, the oxide semiconductor layer and the second metal layer are treated.

To complete the fabrication of the TFT device, the method 1200 may continue with the process operations described above with respect to the method 900. For example, the second metal layer may be removed as described with respect to block 914. A second dielectric layer may be formed on the first metal layer and the oxide as described with respect to block 916. A portion of the second dielectric layer and the oxide may be removed to expose the heavily doped n-type oxide semiconductor as described with respect to block 918. Contacts to the heavily doped n-type oxide semiconductor in the source region and the drain region may be formed as described with respect to block 920.

Figure 13:
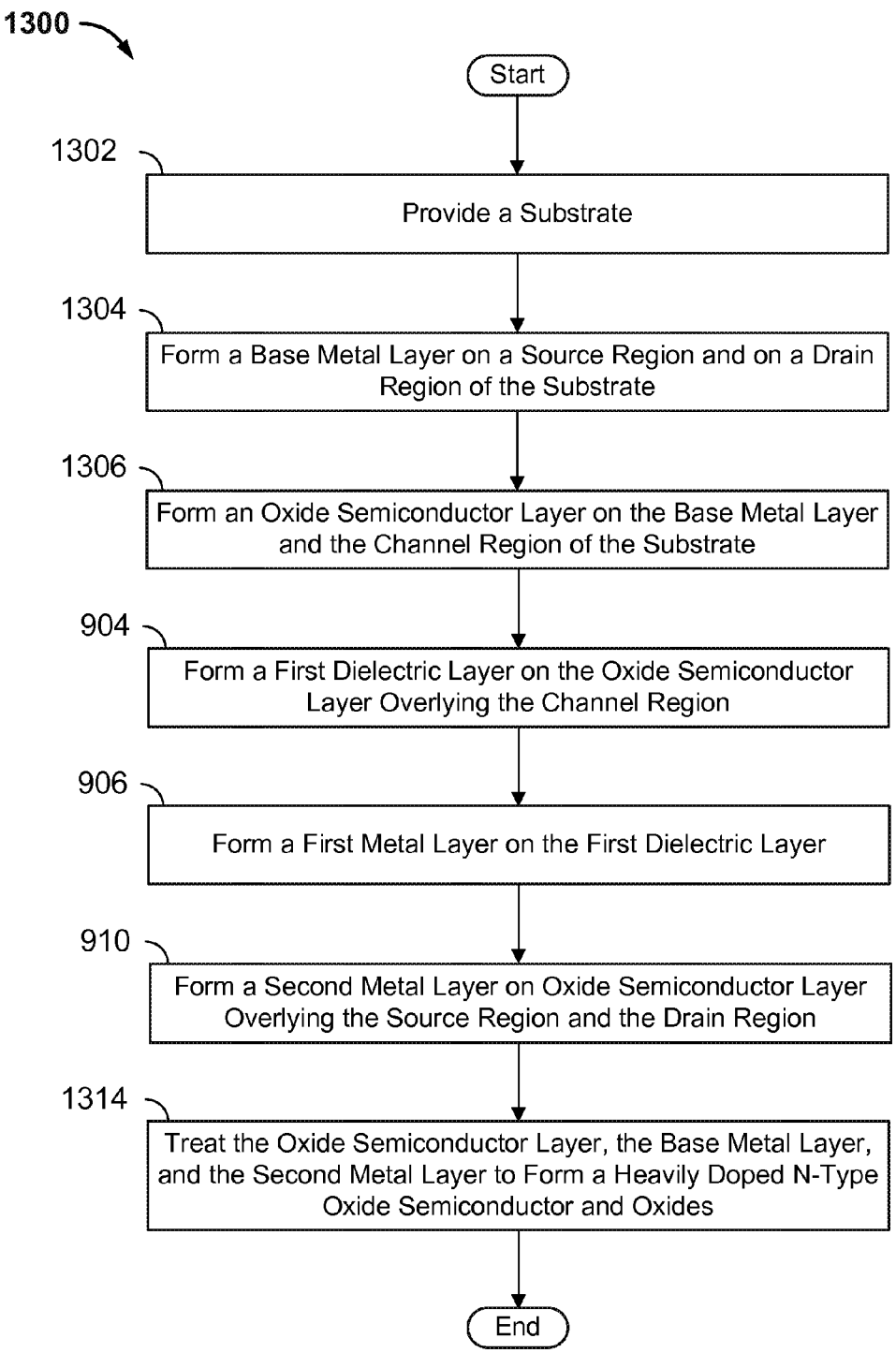

FIG. 13 shows an example of a flow diagram illustrating a manufacturing process for a thin film transistor device. FIGS. 14A-14E show examples of cross-sectional schematic illustrations of various stages in a method of making a thin film transistor device.

Implementations of the method 1300 shown in FIG. 13 are similar to implementations of the method 900. In the method 1300, however, a base metal layer is formed on at least a portion of the source region and on the drain region of the substrate. Then, an oxide semiconductor layer is formed on the channel region of the substrate and on the base metal layer on the source region and the drain region. After formation of the oxide semiconductor layer, implementations of the method 1300 may proceed in a similar manner as in method 900, as described below. A metal layer on the bottom side and on the top side of the oxide semiconductor, as in the method 1300, however, provides a larger oxygen reservoir than a metal layer on the top side of the oxide semiconductor, as in the method 900. The method 1300 is described further, below.

At block 1302 of the method 1300, a substrate is provided. The substrate may be any number of different substrate materials, including transparent materials and non-transparent materials. In some implementations, the substrate is silicon or a glass (e.g., a display glass or a borosilicate glass). In some implementations, the substrate includes a source region, a channel region, and a drain region. In some implementations, the substrate on which the TFT device is fabricated has dimensions of a few microns to hundreds of microns.

In some implementations, a surface of the substrate on which the TFT device is fabricated includes a buffer layer. The buffer layer may serve as an insulation surface. In some implementations, the buffer layer is an oxide, such as $SiO_2$ or $Al_2O_3$. In some implementations, the buffer layer is about 100 to 1000 nm thick.

At block 1304, a base metal layer is formed on the source region and of the drain region of the substrate. In some implementations, a base metal layer is formed on a portion of the source region and a portion of the drain region of the substrate. In some other implementations, a base metal layer is formed on the entire source region and the entire drain region of the substrate.

In some implementations, the metal of the base metal layer is a metal that forms an oxide having a lower Gibbs free energy than the Gibbs free energies of the oxides in an oxide semiconductor layer of the TFT device. In some implementations, the metal of the base metal layer is Ti, Mn, or Mg. The base metal layer may be formed using deposition processes as known by a person having ordinary skill in the art, including physical vapor deposition (PVD) processes, chemical vapor deposition (CVD) processes, and atomic layer deposition (ALD) processes. In some implementations, the base metal is about 10 to 200 nm thick.

In some implementations, the base metal layer is formed on the source region, the channel region, and the drain region of a substrate. The base metal can then be removed from the channel region using photolithography and etching processes. Alternatively, in some implementations a mask is used to mask the channel region and the base metal layer is formed on the source region and the drain region of the substrate. In some other implementations, a mask is used to mask the channel region and portions of the source region and the drain region immediately adjacent to the channel region. The extent of the portions of the source region and/or the drain region that are masked may be varied, depending on the TFT device being fabricated. For example, if the TFT device will include dielectric sidewalls, the portions of the source region and the drain region underlying the dielectric sidewalls may be masked to prevent base metal formation on these portions. The mask may then be removed.

Figure 14A:
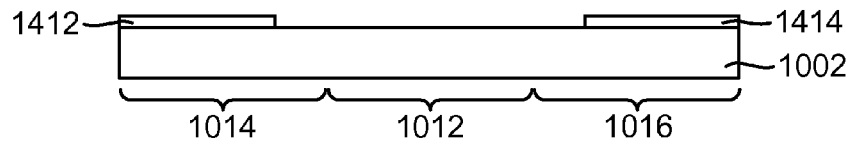
FIGS. 14A-14E show examples of cross-sectional schematic illustrations of various stages in a method of making a thin film transistor device.

FIG. 14A shows an example of the TFT device at this point (e.g., up to the block 1304) in the method 1300. The TFT device includes a substrate 1002. The substrate 1002 includes a source region 1014, a drain region 1016, and a channel region 1012. A base metal layer 1412 is on a portion of the source region of the substrate and a base metal layer 1414 is on a portion of the drain region of the substrate.

At block 1306, an oxide semiconductor layer is formed on the base metal layer and on the channel region of the substrate. In some implementations, block 1306 is similar to block 902 in the method 900. The oxide semiconductor layer may be any number of different oxide semiconductor materials, as noted above. In some implementations, the oxide semiconductor layer is about 10 to 100 nm thick.

Figure 14B:
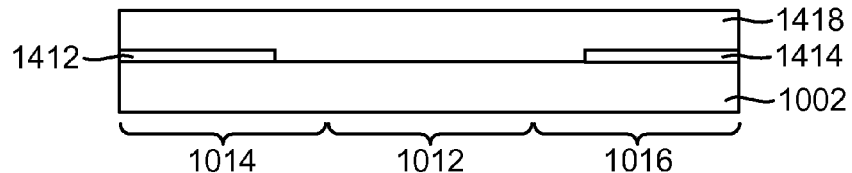

FIG. 14B shows an example of the TFT device at this point (e.g., up to the block 1306) in the method 1300. The TFT device includes an oxide semiconductor layer 1418 on the channel region 1012 of the substrate and on the base metal layers 1412 and 1414.

The method 1300 continues with process operations described above with respect to the method 900. At block 904, a first dielectric layer is formed on the oxide semiconductor layer overlying the channel region. At block 906, a first metal layer is formed on the first dielectric layer. In some implementations, dielectric sidewalls associated with the first metal layer and the first dielectric layer are formed, as described above with respect to block 908.

Figure 14C:
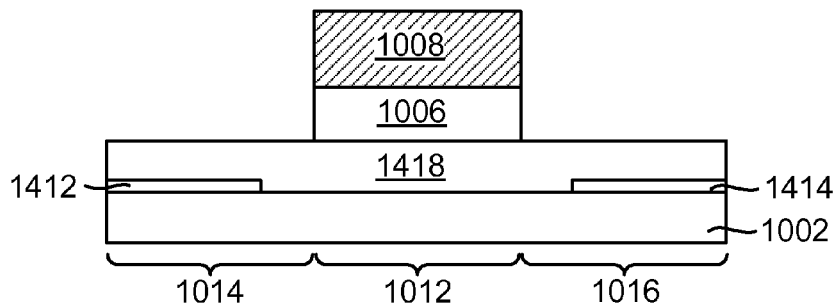

FIG. 14C shows an example of the TFT device at this point (e.g., up to the block 906) in the method 1300. The TFT device includes a first dielectric layer 1006 and a first metal layer 1008.

The method 1300 continues with process operations described above with respect to the method 900. At block 910, a second metal layer is formed on the oxide semiconductor layer overlying the source region and the drain region. In some implementations, the metal of the second metal layer is the same as the metal of the base metal layer. In some other implementations, the metal of the second metal layer is one of Ti, Mn, or Mg, but is a different metal from the metal of the base metal layer.

Figure 14D:
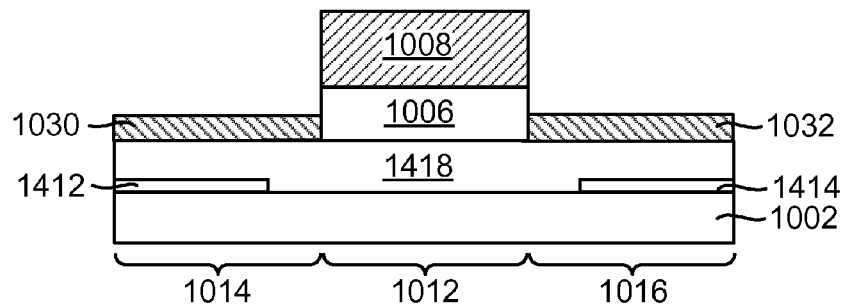

FIG. 14D shows an example of the TFT device at this point (e.g., up to the block 910) in the method 1300. The TFT device includes second metal layers 1030 and 1032. As shown in FIG. 14D, the second metal layers 1030 and 1032 are formed on the oxide semiconductor layer overlying the source region 1014 and the drain region 1016, respectively. In some other implementations, the second metal layer is also formed on the sides of the first dielectric layer 1006 and on the first metal layer 1008.

At block 1314, the oxide semiconductor layer, the base metal layer, and the second metal layer are treated to form a heavily doped n-type oxide semiconductor and oxides. In some implementations, block 1312 is similar to block 912 in the method 900. In some implementations, the treatment forms a heavily doped n-type oxide semiconductor in the oxide semiconductor layer overlying the source region and the drain region. The treatment also forms an oxide in the second metal layer on the oxide semiconductor layer overlying the source region and the drain region and in the base metal layer.

As described above, controlling the amount of oxygen diffusion out of the oxide semiconductor layer may be used to control the level of doping in the oxide semiconductor layer. The base metal layer in the method 1300 acts as an additional means of removing oxygen from the oxide semiconductor layer. The base metal layer serves as an additional metal to the second metal layer into which oxygen may diffuse; i.e., the base metal layer may serve as an additional oxygen reservoir. For example, the base metal layer may be used when a large amount of oxygen is to be removed from the oxide semiconductor layer overlying the source region and the drain region. As another example, the formation of an oxide in the second metal layer may hinder oxygen diffusion into the remaining second metal layer on top of the oxide that is formed. This may slow the kinetics of the oxygen diffusion out of the oxide semiconductor layer. In these instances, the base metal layer would aid in the formation of the heavily doped n-type oxide semiconductor.

As noted above, a base metal layer may be formed on a portion of the source region and a portion of the drain region in some implementations. The area of the source region and the area of the drain region on which the base metal layer is formed and the thickness of the base metal layer may be further specified to control the amount of oxygen diffusion out of the oxide semiconductor layer.

Figure 14E:
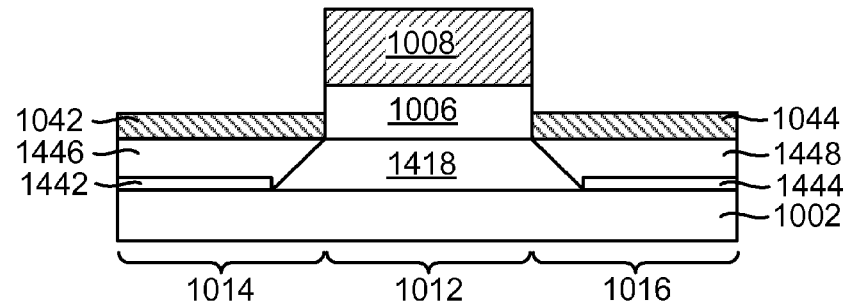

FIG. 14E shows an example of the TFT device at this point (e.g., up to the block 1314) in the method 1300. The TFT device includes heavily doped n-type oxide semiconductor layers 1446 and 1448 overlying the source region 1014 and the drain region 1016. These heavily doped n-type oxide semiconductor layers 1446 and 1448 serve as a source and a drain in a TFT device. The oxide semiconductor layer 1418 not converted to a heavily doped n-type oxide semiconductor serves as a channel in a TFT device.

The TFT device includes an oxide layer 1042 overlying and an oxide layer 1442 underlying the heavily doped n-type oxide semiconductor layer 1446. The TFT device also includes an oxide layer 1044 overlying and an oxide layer 1444 underlying the heavily doped n-type oxide semiconductor layer 1448. The oxide layers are a metal oxide formed from the metal of the second metal layer and the base layer reacting with oxygen from the oxide semiconductor layer. In some implementations, the oxide layers 1042 and 1044 may act as passivation insulators.

As noted above, in some implementations, not all of the metal contacting the oxide semiconductor layer 1418 is oxidized. In these implementations, metal of the second metal layer would remain on top of the oxide 1042 and 1044. Further, in some implementations, not all of the base metal layer is oxidized.

To complete the fabrication of the TFT device, the method 1300 may continue with the process operations described above with respect to the method 900. For example, the second metal layer may be removed as described with respect to block 914. A second dielectric layer may be formed on the first metal layer and the oxide as described with respect to block 916. A portion of the second dielectric layer and the oxide may be removed to expose the heavily doped n-type oxide semiconductor as described with respect to block 918. Contacts to the heavily doped n-type oxide semiconductor in the source region and the drain region may be formed as described with respect to block 920.

Many variations of the methods 900, 1200, and 1300 illustrating manufacturing processes for a TFT device may exist. For example, the method 900 may not include the formation of dielectric sidewalls at block 908. As another example, in some implementations of the method 900, the second metal layer may not be removed at block 914 if all of the second metal layer is oxidized and the second metal layer was not formed on the dielectric sidewalls and the first metal layer. As yet another example, in some implementations of the method 1300, block 906 may be preformed after block 1314. In such implementations, photolithography techniques may be used to deposit the first metal layer on the first dielectric layer. Further, the methods 900, 1200, and 1300 may be used to fabricate a TFT device including, in addition to a top gate, a bottom gate.

Figure 15A:
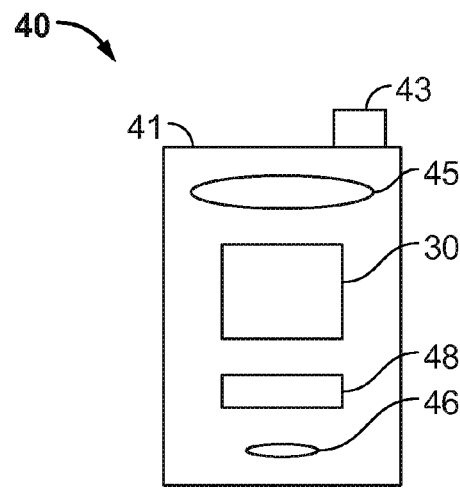
FIGS. 15A and 15B show examples of system block diagrams illustrating a display device that includes a plurality of interferometric modulators.
Figure 15B:
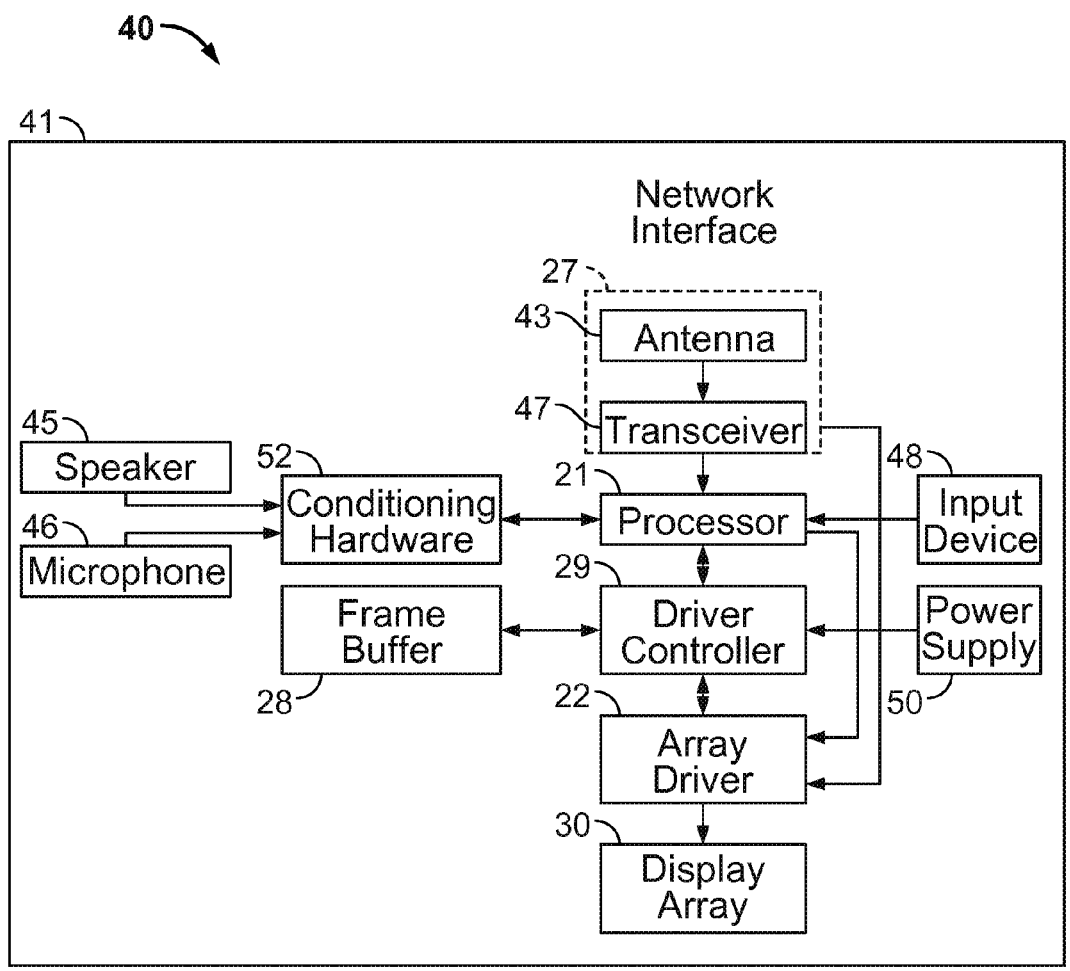

FIGS. 15A and 15B show examples of system block diagrams illustrating a display device 40 that includes a plurality of interferometric modulators. The display device 40 can be, for example, a cellular or mobile telephone. However, the same components of the display device 40 or slight variations thereof are also illustrative of various types of display devices such as televisions, e-readers and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 15B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 can provide power to all components as required by the particular display device 40 design.

The network interface 27 includes the antenna 43 and the transceiver 47 so that the display device 40 can communicate with one or more devices over a network. The network interface 27 also may have some processing capabilities to relieve, e.g., data processing requirements of the processor 21. The antenna 43 can transmit and receive signals. In some implementations, the antenna 43 transmits and receives RF signals according to the IEEE 16.11 standard, including IEEE 16.11 (a), (b), or (g), or the IEEE 802.11 standard, including IEEE 802.11a, b, g or n. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (e.g., an IMOD controller). Additionally, the array driver 22 can be a conventional driver or a bi-stable display driver (e.g., an IMOD display driver). Moreover, the display array 30 can be a conventional display array or a bi-stable display array (e.g., a display including an array of IMODs). In some implementations, the driver controller 29 can be integrated with the array driver 22. Such an implementation is common in highly integrated systems such as cellular phones, watches and other small-area displays.

In some implementations, the input device 48 can be configured to allow, e.g., a user to control the operation of the display device 40. The input device 48 can include a keypad, such as a QWERTY keyboard or a telephone keypad, a button, a switch, a rocker, a touch-sensitive screen, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices as are well known in the art. For example, the power supply 50 can be a rechargeable battery, such as a nickel-cadmium battery or a lithium-ion battery. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising a thin film transistor (TFT), the TFT comprising:
   a substrate including a surface;
   an oxide semiconductor layer disposed over the substrate surface, a channel region of the oxide semiconductor layer being between a source region and a drain region of the oxide semiconductor layer, the source region and the drain region of the oxide semiconductor layer being a heavily doped n-type oxide semiconductor;
   a gate dielectric on the channel region of the oxide semiconductor layer;
   a gate metal on the gate dielectric, wherein the gate metal defines the channel region of the oxide semiconductor layer;
   a source metal oxide on the source region and a drain metal oxide on the drain region of the oxide semiconductor layer, wherein the source metal oxide defines the source region and the drain metal oxide defines the drain region of the oxide semiconductor layer;
   a passivation dielectric on the gate metal and on the source metal oxide and the drain metal oxide;
   a first metal contact extending through the source metal oxide and contacting the source region of the oxide semiconductor layer; and
   a second metal contact extending through the drain metal oxide and contacting the drain region of the oxide semiconductor layer.

2. The apparatus of claim 1, further comprising:
   a buffer layer dielectric on the substrate surface, wherein the oxide semiconductor layer is on the buffer layer dielectric.

3. The apparatus of claim 1, wherein the substrate includes a glass.

4. The apparatus of claim 1, further comprising:
   a base metal oxide underlying the source region and the drain region of the oxide semiconductor layer.

5. The apparatus of claim 1, further comprising:
   a display including an array of display elements, at least one display element connected to the TFT;
   a processor that is configured to communicate with the display, the processor being configured to process image data; and
   a memory device that is configured to communicate with the processor.

6. The apparatus of claim 5, further comprising:
   a driver circuit configured to send at least one signal to the TFT.

7. The apparatus of claim 6, further comprising:
   a controller configured to send at least a portion of the image data to the driver circuit.

8. The apparatus of claim 5, further comprising:
   an image source module configured to send the image data to the processor.

9. The apparatus of claim 8, wherein the image source module includes at least one of a receiver, transceiver, and transmitter.

10. The apparatus of claim 5, further comprising:
    an input device configured to receive input data and to communicate the input data to the processor.

11. The apparatus of claim 1, further comprising:
    dielectric sidewalls on sides of the gate dielectric and the gate metal and disposed over a portion of the oxide semiconductor layer.

12. A thin film transistor (TFT) device comprising:
    a substrate including a surface;
    an oxide semiconductor layer disposed over the substrate surface, a channel region of the oxide semiconductor layer being between a source region and a drain region of the oxide semiconductor layer, the source region and the drain region of the oxide semiconductor layer being a heavily doped n-type oxide semiconductor;
    a gate dielectric on the channel region of the oxide semiconductor layer;
    a gate metal on the gate dielectric, wherein the gate metal defines the channel region of the oxide semiconductor layer;
    source means for removing oxygen from the oxide semiconductor layer on the source region of the oxide semiconductor layer, wherein the source removing means defines the source region;
    drain means for removing oxygen from the oxide semiconductor layer on the drain region of the oxide semiconductor layer, wherein the drain removing means defines the drain region of the oxide semiconductor layer;
    a passivation dielectric on the gate metal and on the source removing means and the drain removing means;
    a first metal contact extending through the source removing means and contacting the source region of the oxide semiconductor layer; and
    a second metal contact extending through the drain removing means and contacting the drain region of the oxide semiconductor layer.

13. The TFT device of claim 12, further comprising:
a base means for removing oxygen from the oxide semiconductor layer underlying the source region and the drain region of the oxide semiconductor layer.

14. The TFT device of claim 12, further comprising:
dielectric sidewalls on sides of the gate dielectric and the gate metal and disposed over a portion of the oxide semiconductor layer.

\* \* \* \* \*